(12) United States Patent
Armstrong et al.

(10) Patent No.: US 8,874,955 B2
(45) Date of Patent: Oct. 28, 2014

(54) REDUCING IMPACT OF A SWITCH FAILURE IN A SWITCH FABRIC VIA SWITCH CARDS

(75) Inventors: William J. Armstrong, Rochester, MN (US); John M. Borkenhagen, Rochester, MN (US); Martin J. Crippen, Apex, NC (US); Dhruv M. Desai, Cary, NC (US); David R. Engebretsen, Cannon Falls, MN (US); Philip R. Hillier, III, Rochester, MN (US); William G. Holland, Cary, NC (US); James E. Hughes, Apex, NC (US); James A. O'Connor, Ulster Park, NY (US); Steven M. Tri, Eyota, MN (US)

(73) Assignee: International Business Machines Corporation, Armonk, NY (US)

( * ) Notice: Subject to any disclaimer, the term of this patent is extended or adjusted under 35 U.S.C. 154(b) by 381 days.

(21) Appl. No.: 13/177,639

(22) Filed: Jul. 7, 2011

(65) Prior Publication Data

US 2013/0013957 A1   Jan. 10, 2013

(51) Int. Cl.
*G06F 11/00* (2006.01)
*H05K 7/14* (2006.01)
*G06F 15/16* (2006.01)
*H04L 12/24* (2006.01)
*G06F 11/16* (2006.01)
*G06F 1/18* (2006.01)

(52) U.S. Cl.
CPC .......... *H04L 41/0654* (2013.01); *H05K 7/1492* (2013.01); *G06F 15/161* (2013.01); *H05K 7/1445* (2013.01); *G06F 11/16* (2013.01); *G06F 1/183* (2013.01)
USPC ....................................... 714/4.12

(58) Field of Classification Search
USPC .......................................... 714/4.12
See application file for complete search history.

(56) References Cited

U.S. PATENT DOCUMENTS

| 6,339,546 | B1 | 1/2002 | Katayama et al. |
| 6,976,112 | B2 * | 12/2005 | Franke et al. ............... 710/302 |
| 7,191,347 | B2 * | 3/2007 | Bigelow et al. ............. 713/300 |
| 7,295,446 | B2 | 11/2007 | Crippen et al. |

(Continued)

FOREIGN PATENT DOCUMENTS

WO   2007064466 A2   6/2007

OTHER PUBLICATIONS

Combined Search and Examination Report from the United Kingdom Intellectual Property Office dated Aug. 29, 2012.

(Continued)

*Primary Examiner* — Christopher McCarthy
(74) *Attorney, Agent, or Firm* — Patterson & Sheridan LLP

(57) ABSTRACT

Techniques are disclosed for reducing impact of a switch failure in a switch fabric. In one embodiment, a server system is provided that includes a midplane, one or more server cards and one or more switch cards. The midplane may include a fabric interconnect for a switch fabric. The one or more server cards may be coupled with the midplane, where each server card is hot-swappable from the midplane. The one or more switch cards may also be coupled with the midplane, where each switch card is also hot-swappable from the midplane. Each switch card includes one or more switch modules, and each switch module is configured to switch network traffic for at least one server card.

24 Claims, 17 Drawing Sheets

(56) References Cited

U.S. PATENT DOCUMENTS

| | | |
|---|---|---|
| 7,310,306 B1 | 12/2007 | Cheriton |
| 7,356,638 B2 | 4/2008 | Holland et al. |
| 7,359,317 B1 | 4/2008 | DeCesare et al. |
| 7,418,633 B1 * | 8/2008 | Salpekar et al. ................ 714/43 |
| 7,529,819 B2 | 5/2009 | Chen et al. |
| 7,636,823 B1 | 12/2009 | Fiske et al. |
| 8,250,382 B2 | 8/2012 | Maglione et al. |
| 8,433,190 B2 | 4/2013 | Wellbrock et al. |
| 2002/0080575 A1 * | 6/2002 | Nam et al. .................... 361/686 |
| 2002/0091969 A1 | 7/2002 | Chen et al. |
| 2002/0097672 A1 * | 7/2002 | Barbas et al. ................ 370/216 |
| 2002/0124114 A1 | 9/2002 | Bottom et al. |
| 2004/0255190 A1 * | 12/2004 | Sidhu et al. .................... 714/13 |
| 2007/0083707 A1 | 4/2007 | Holland et al. |
| 2008/0056123 A1 | 3/2008 | Howard et al. |
| 2008/0288685 A1 * | 11/2008 | Dalton et al. ................ 710/106 |
| 2010/0165983 A1 | 7/2010 | Aybay et al. |
| 2012/0117040 A1 | 5/2012 | Hostetter et al. |
| 2012/0170191 A1 * | 7/2012 | Jensen et al. ............. 361/679.02 |
| 2013/0010639 A1 | 1/2013 | Armstrong et al. |
| 2013/0094348 A1 | 4/2013 | Armstrong et al. |
| 2013/0094351 A1 | 4/2013 | Armstrong et al. |
| 2013/0097314 A1 | 4/2013 | Austen et al. |
| 2013/0100799 A1 | 4/2013 | Armstrong et al. |
| 2013/0103329 A1 | 4/2013 | Armstrong et al. |

OTHER PUBLICATIONS

Titled, "Reducing Impact of a Repair Actions in a Switch Fabric," filing Date: Jul. 7, 2011.

Titled, "Reducing Impact of Repair Actions Following a Switch Failure in a Switch Fabric," Filing Date: Jul. 7, 2011.

Titled, "Switch Fabric Management," Filing Date: Jul. 7, 2011.

Titled, "Managing Inventory Data for Components of a Server System," Filing Date: Jul. 7, 2011.

* cited by examiner

REDUCING IMPACT OF A SWITCH FAILURE IN A SWITCH FABRIC VIA SWITCH CARDS

BACKGROUND

Although early computer architectures utilized standalone, single computers, often referenced as Personal Computers (PCs), more powerful modern computer systems often use multiple computers that are coupled together in a common chassis. An exemplary common chassis is known as a blade chassis, which includes multiple server blades that are coupled by a common backbone within the blade chassis. Each server blade is a pluggable board that includes at least one processor, on-board memory, and an Input/Output (I/O) interface. The multiple server blades are configured to communicate with one another and to share common resources such as storage devices, monitors, input devices, etc. Further, one or multiple blade chassis may make up a blade system, which is often dedicated to a single enterprise and/or a particular function, such as processing loans, managing payroll, etc.

SUMMARY

One embodiment of the invention provides a system that includes a midplane, one or more server cards coupled with the midplane and one or more switch cards coupled with the midplane. The midplane includes a fabric interconnect for a switch fabric. Each server card is hot-swappable from the midplane. The one or more switch cards are operatively connected to the one or more server cards. Each switch card is hot-swappable from the midplane and includes one or more switch modules. Each switch module is configured to switch network traffic for at least one of the one or more server cards. A first switch module of a first switch card is configured to switch network traffic for the one or more server cards upon a failure of a second switch module that is included in one of the first switch card and a second switch card.

Another embodiment of the invention provides a switch module that includes a computer processor and a memory. The memory stores management firmware which, when executed on the computer processor, performs an operation that includes switching network traffic for a first server card in a server system. The operation also includes switching, upon failure of a second switch module that switches network traffic for a second server card, network traffic for the second server card. The switch module is included in a first switch card. The second switch module is included in one of the first switch card and a second switch card. Each switch card and each server card is coupled with a midplane. The midplane includes a fabric interconnect for a switch fabric. Each interposer card is hot-swappable from the midplane, and each server card is hot-swappable from the respective interposer card.

Yet another embodiment of the invention provides a computer-implemented method that includes detecting that a first switch module of a first switch card has failed, in a server system that includes a midplane, one or more server cards coupled with the midplane and one or more switch cards coupled with the midplane. The one or more server cards are operatively connected to the one or more switch cards. The midplane includes a fabric interconnect for a switch fabric. Each switch card includes one or more switch modules. Each switch module is configured to switch network traffic for at least one of the one or more server cards. Each server card and each switch card is hot-swappable from the midplane. The operation also includes switching, upon detecting that the first switch module of the first switch card has failed, network traffic for the one or more server cards by a second switch module that is included in one of the first switch card and a second switch card.

BRIEF DESCRIPTION OF THE DRAWINGS

So that the manner in which the above recited aspects are attained and can be understood in detail, a more particular description of embodiments of the invention, briefly summarized above, may be had by reference to the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
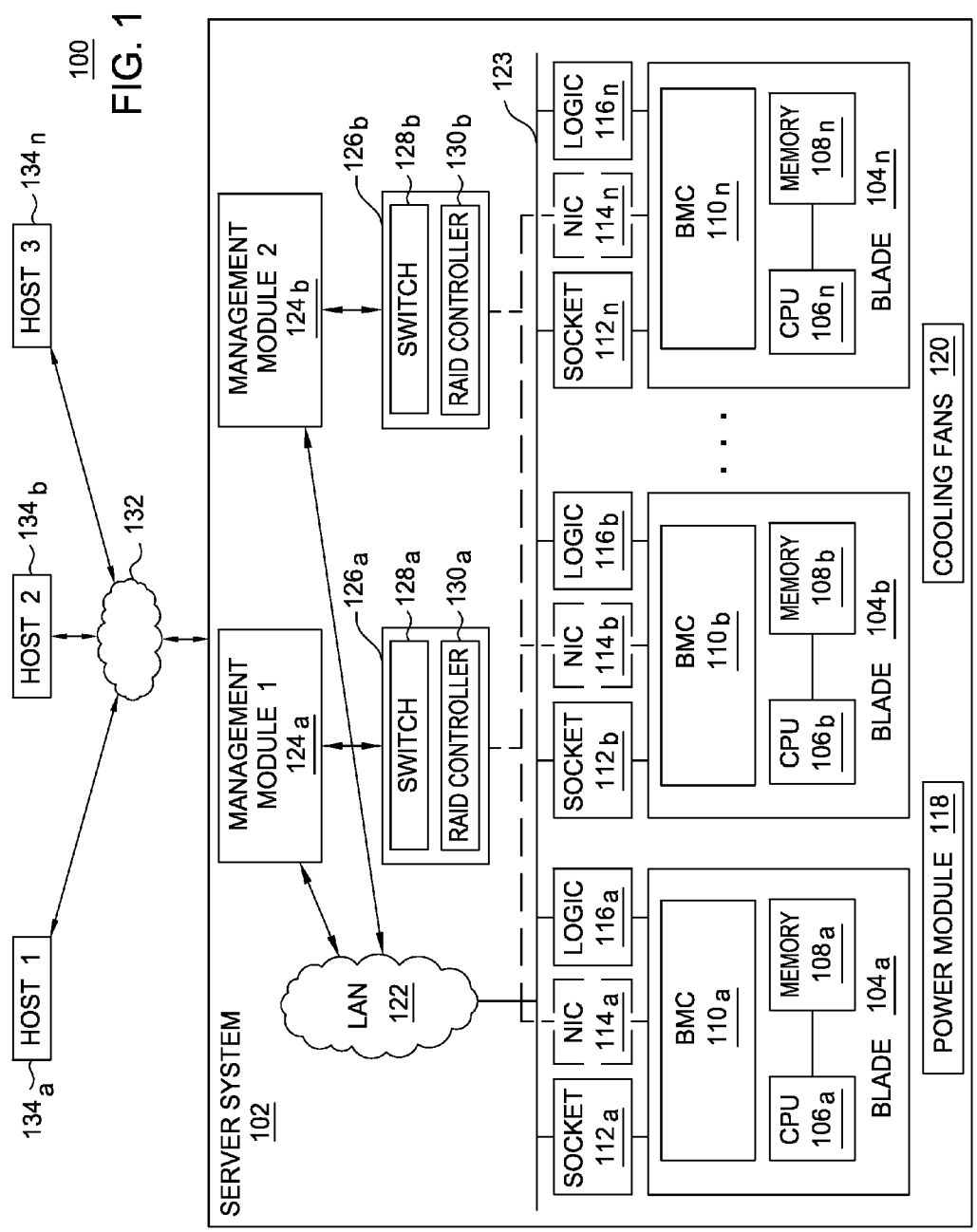
FIG. 1 is a block diagram of a computing environment having several hosts with access to a server system, according to one embodiment of the invention.

Embodiments of the invention reduce impact of a switch failure in a switch fabric. As used herein, a switch fabric refers to a network topology where network nodes connect with each other via one or more network switches. In one embodiment, a server system is provided that includes a midplane, a first interposer card, and one or more server cards, each server card corresponding to one or more network nodes. In one embodiment, each server card may be a server blade, also referred to as a blade server or blade. Although described with reference to the first interposer card, the midplane may be configured to couple with a plurality of interposer cards. The first interposer card is disposed between the midplane and the one or more server cards, thereby operatively connecting the midplane to the one or more server cards. Further, the first interposer card includes a switch module that switches network traffic for the one or more server cards. The first interposer card is hot-swappable from the midplane, and the one or more server cards are hot-swappable from the first interposer card.

In one embodiment, when the switch module fails, the switch module may be replaced using a repair action that minimizes or reduces impact to the switch fabric. The repair action includes replacing the first interposer card with a second interposer card that includes a functional switch module and reintegrating the second interposer card into the network fabric via a configuration tool executing on the server system. Due to the packaging of the server system and the hot-swappable properties of the interposer cards and the server cards, the repair action may be performed without disrupting the server system or the switch fabric—e.g., without powering off or restarting the server system and/or switch fabric. Where the switch fabric provides redundancy in terms of connectivity, the repair action may also minimize or reduce impact to the provided redundancy. Accordingly, the impact of the repair action is localized to the server card. In other words, the impact of the repair action to the switch fabric is only to an extent of the first interposer card and/or the server card; the server system and switch fabric—namely, other interposer cards and server cards operatively connected to the midplane—remain operational. Advantageously, the impact of the repair action is reduced compared to a physical configuration or packaging that requires powering off the server system and/or switch fabric to replace the switch module—e.g., by replacing the midplane or by replacing a non-hot-swappable switch card coupled to the midplane. Availability of the server system and/or switch fabric is thereby improved, and costs associated with the repair action are thereby reduced.

In one embodiment, the availability of the server system and/or switch fabric—or redundancy characteristics thereof—may be improved relative to a second packaging of the server system that would require the midplane to be replaced to remedy a failed switch module. For example, the second packaging of the server system may include one or more switch chips interconnected on a single card (or planar board) that is coupled with the midplane. Coupling the single card to the midplane may provide an increased a number of ports, provide increased bandwidth, and/or improve availability of the switch fabric. The second packaging of the server system may also include multiple redundant paths through multiple switch chips, such that the server system can continue to operate if a switch chip fails. However, other failures that affect the single card to the planar board can cause a portion of or even the entire switch fabric to cease functioning. Examples of the other failures include power component failures, Voltage Regulator Module (VRM) failures, power plane shorts, etc.

In one embodiment, even if the switch fabric can remain operational in the presence of one or more failed switch chips, a repair action on the one or more failed switch chips may require the single card, planar board, and/or midplane to be replaced, resulting in a loss of operation of at least the portion of the switch fabric supported by the midplane during the repair action. To avoid the loss of operation during the repair action, the server system may be configured to include a second, fully-redundant single card (or planar board). Alternatively, the server system may be packaged using the techniques disclosed herein to reduce the impact of the repair action on the switch fabric while avoiding the cost of configuring the server system with a second, fully-redundant single card or planar board. Accordingly, the availability of the server system may be improved, because single points of failure (SPOFs) and/or single points of repair (SPORs) are reduced or minimized. SPOFs are said to be eliminated when the server system can continue to operate in the presence of any component failure. SPORs are said to be eliminated when the server system can continue to operate while any (failed) component is being repaired or replaced.

In one embodiment, the server system may be packaged to include an interconnect between a first interposer card and a second interposer card. The interconnect may be referred to herein as an interposer interconnect or a switch interconnect. The interposer interconnect may include cabling between a network adapter of the first interposer card and a network adapter of the second interposer card, where the cabling is external to the midplane. Accordingly, should a switch module of the first interposer card fail, a switch module of the second interposer card may manage network traffic for a server card on behalf of the failed interposer card—in addition to a server card of the second interposer card. Thus, packaging the server system to include the interposer interconnect eliminates the switch module of the first interposer card as an SPOF. In other words, the server card of the first interposer card retains connectivity to the switch fabric and/or redundancy thereof, even when the switch module of the first interposer card fails. Packaging the server system according to the embodiments described herein reduces and/or eliminates both SPORs and SPOFs.

In an alternative embodiment, packaging the server system to include one or more switch cards coupled with the midplane eliminates the switch module as a SPOF. The midplane includes a fabric interconnect for a switch fabric. The switch cards are coupled with a first face of the midplane, and one or more server cards are coupled with a second face of the midplane. Further, the switch cards may be aligned along a first axis and the server cards may be aligned along a second axis. The first and second axes may be perpendicular to one another. For example, the switch cards may be horizontally coupled with the first face of the midplane, and the server cards may be vertically coupled with the second face of the midplane, or vice versa. The switch fabric includes wiring connecting each switch card with each server card and/or wiring that connects the switch cards to one another. Doing so provides redundant pathing to reduce and/or eliminate SPORs and/or SPOFs in the switch fabric as well as reduces an overall amount of wiring needed (at least some cases). Advantageously, the switch module may be eliminated as an SPOF without requiring any interposer cards or associated wiring.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments of the present invention. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 1 is a block diagram of a computing environment 100 having several hosts with access to a server system 102, according to one embodiment of the invention. Although only three hosts 134a,b,n are depicted for clarity, those skilled in the art will appreciate that additional hosts may have access to the server system 102. The hosts 134a,b,n are connected through a network fabric 132 to the server system 102.

Depending on the embodiment, each host 134a,b,n may act as a client that accesses functionality provided by the server system 102 and/or may provide respective server functionality external to the server system 102. The network fabric 132 may be a telecommunications network and/or a wide area network (WAN). In a particular embodiment, the network fabric 132 is the Internet. The server system 102 includes a chassis that houses server blades 104a,b,n. The server blades 104a,b,n are coupled to a midplane 123, which provides mechanical and logical connections (e.g., data and control signal interchange) among the server blades 104a,b,n. Although three server blades 104a,b,n are depicted, those skilled in the art will appreciate that additional server blades may be connected to the midplane 123. Further, although embodiments are described herein with reference to blade systems, other form factors or physical configurations (e.g., rack systems) are broadly contemplated.

Further, although embodiments are described herein with reference to the server blades 104a,b,n being coupled to the midplane 123, those skilled in the art will recognize that more generally, the server blades may be coupled to any printed circuit board (PCB) that serves as a backbone for the chassis, such as a backplane, motherboard, etc. Further still, although embodiments are described herein with reference to the server system 102 having a single chassis, those skilled in the art will recognize that in other embodiments, the server system 102 may include multiple chassis. For example, in an alternative embodiment, the server system 102 may be a blade system that includes at least two blade chassis, each having a plurality of blades.

In one embodiment, the server system 102 further includes one or more management modules 124. In the depicted embodiment, the server system 102 includes a primary management module 124a and a backup management module 124b. Each management module 124 is capable of managing multiple server blades 104. During normal operation, one of the management modules 124 is operatively connected to the server blades 104 via a local area network (LAN) 122, the midplane 123 and a Baseboard Management Controllers (BMCs) 110 of each server blade 104 to form an in-band management pathway. In one embodiment, the network fabric 132 serves as an extension to the LAN 122. The LAN 122 and BMC 110 are further discussed below.

In one embodiment, the midplane 123 is mounted in the middle of the chassis of the server system 102 and contains circuitry and sockets 112 into which additional electronic devices or cards, including server blades 104, may be inserted. The midplane 123 includes at least one bus for secure in-band internal communication via the BMCs 110 and between the management modules 124 and the server blades 104 and/or amongst the server blades 104 themselves.

In one embodiment, when a server blade 104 is inserted into a specific socket 112, a physical address is established for the server blade 104. For example, assume that server blade 104a is inserted into the socket 112a. In one embodiment, control logic 116a detects presence of the server blade 104a in the socket 112a. The control logic 116a may comport with the Electronics Industry Association (EIA) RS485 Standard for data communication. In other embodiments, the control logic 116a may be compliant with the Phillips' Inter-IC (Inter-Integrated Circuit, or I²C) standard or with an Ethernet network standard. The control logic 116a, operating in conjunction with the management module 124a, assigns a physical address on a bus in the midplane 123 to the server blade 104a responsive to insertion of the server blade 104a into the socket 112a. As shown, each server blade 104 is associated with a respective control logic 116 that is operatively connected to the midplane 123. In an alternative embodiment, multiple server blades 104 may share a single control logic 116.

In one embodiment, each server blade 104 is assigned a unique Internet Protocol (IP) address on the midplane 123. That is, the midplane 123 may support intercommunication using IP addressing protocol, in which each device that is operatively connected to the midplane 123 has an IP address assigned by logic (not shown) that is either within or outside the chassis of the server system 102. For example, a Dynamic Host Configuration Protocol (DHCP) server may be used to assign an IP address to the server blade 104a. Communication with the server blade 104a thereafter occurs via a network interface controller (NIC) 114a associated with the server blade 104a. The NIC 114a may be any type of network communications device allowing the server blade 104a to communicate with other server blades 104b,n and/or computers via the LAN 122 and/or the network fabric 132.

In one embodiment, an integrated module 126a is operatively connected to the NIC 114a. The integrated module 126a may be used in pairs (e.g., with integrated module 126b) to provide redundancy. As is known, Small Computer System Interface (SCSI) refers to a set of standards for physically connecting and transferring data between computers and peripheral devices. In one embodiment, the integrated modules 126 include switch modules 128, such as a Serial Attached SCSI (SAS) switch module. The switch modules 128 provide, for the server blades 104, connectivity to Ethernet, Fibre Channel over Ethernet (FCoE), SAS, etc. In one embodiment, each switch module 128 is a switch chip. Depending on the embodiment, the integrated modules 126 may further include redundant array of independent disks (RAID) controllers 130. Each RAID controller 130 is interconnected to RAID devices, such as storage devices in a RAID configuration. The RAID devices may be located within one or more of the server blades 104. The RAID controllers 130 and the RAID devices may collectively be viewed as a RAID subsystem of the server system 102.

In one embodiment, each storage device may be a persistent storage device. Further, each storage device may be a combination of fixed and/or removable storage devices, such as fixed disc drives, floppy disc drives, tape drives, removable memory cards, solid-state drives or optical storage. The memory 108 and the storage device may be part of one virtual address space spanning multiple primary and secondary storage devices.

In one embodiment, each server blade 104 may have at least one central processing unit (CPU) 106 and a memory 108. The CPU 106 is included to be representative of a single CPU, multiple CPUs, a single CPU having multiple processing cores, and the like. Similarly, the memory 108 may be a random access memory. While the memory 108 is shown as a single identity, it should be understood that the memory 108 may comprise a plurality of modules, and that the memory 108 may exist at multiple levels, from high speed registers and caches to lower speed but larger DRAM chips. The memory 108 may be a flash read-only memory ("flash ROM" or "flash memory") that can be erased and reprogrammed in units of memory referred to as "blocks." The memory 108 may also include non-volatile Electrically Erasable Programmable Read Only Memory (EEPROM) that is similar to flash memory, except that EEPROM is erased and rewritten at a byte level and is usually smaller in capacity. Each server blade 104 may be oriented as a processor blade or a storage blade. A processor blade includes one or more processing devices, while a storage blade includes a number of integrated storage devices such as disk drives.

In one embodiment, when the server blade 104 is shipped from a manufacturer, the memory 108 may be pre-burned with firmware, including a basic input/output system (BIOS) and software for monitoring the server blade 104. The monitoring may include controlling storage devices, monitoring and controlling voltages throughout the system, determining the power-on status of the server blade 104, requesting access to a shared keyboard, video, mouse, compact disc read-only memory (CD-ROM) and/or floppy disk drives, monitoring the operating system (OS) running on the server blade 104, etc. Examples of operating systems include UNIX, versions of the Microsoft Windows® operating system, and distributions of the Linux® operating system. More generally, any operating system supporting the functions disclosed herein may be used.

In one embodiment, the management modules 124 are capable of detecting the presence, quantity, type and revision level of each server blade 104, power module 118, and midplane 123 in the system. The management modules 124 may also directly control the operation of each server blade 104 and the power module 118. The management modules 124 may also directly control the operation of cooling fans 120 and other components in the chassis of the server system 102. Directly controlling the operation entails controlling the operation without using the BIOS in the server blades 104. In an alternative embodiment, the management modules 124 may use the BIOS to indirectly control the operation of the cooling fans 120 and the other components in the chassis of the server system 102.

In one embodiment, each server blade 104 includes a baseboard management controller (BMC) 110 that provides local supervisory control of the server blade 104 to which the BMC 110 is associated. Each BMC 110 is configured to communicate with a management module 124 by either using communication path of the LAN 122 (i.e., via an in-band network) or alternatively by using switch modules 128 and NICs 114 (i.e., via an out-of-band network). The management modules 124 may utilize a variety of communications paths in the LAN 122, such as RS485 path, a LAN path, and an I$^2$C path, to communicate with each server blade 104.

In one embodiment, the LAN 240 is an in-band network also comporting with the Electronics Industry Association (EIA) RS485 Standard for data communication. The management modules 124—e.g., either the primary management module 124a or the backup management module 124b if the primary management module 124a is down—communicate via the LAN 122 with the BMC 110, which includes logic for coordinating communication with the server blades 104 via the sockets 112.

In one embodiment, the LAN 122 may be configured to allow communications between the server blades 104 and the management modules 124 relating to the remote BIOS settings and BIOS management. The server blades 104 may use BMCs 110 as proxies to communicate with the management modules 124 through the RS485 protocol. Similarly, the management modules may use BMCs 110 as proxies to communicate with the server blades 104 through the RS485 protocol. In an alternative embodiment, an RS485 connection may be separately made between each server blade 104 and the management modules 124. Additionally, other communications protocols and paths may be utilized over the switch modules 128, such as I$^2$C, TCP/IP, Ethernet, FCoE, etc.

Depending on the embodiment, the server system 102 may also be operatively connected to an input device and/or an output device. The input device may be any device for providing input to the server system 102. For example, a keyboard, keypad, light pen, touch-screen, track-ball, or speech recognition unit, audio/video player, and the like may be used. The output device may be any device for providing output to a user of the server system 102. For example, the output device may be any conventional display screen or set of speakers, along with their respective interface cards, i.e., video cards and sound cards. Further, the input device and output device may be combined. For example, a display screen with an integrated touch-screen, a display with an integrated keyboard, or a speech recognition unit combined with a text speech converter may be used.

Figure 2:
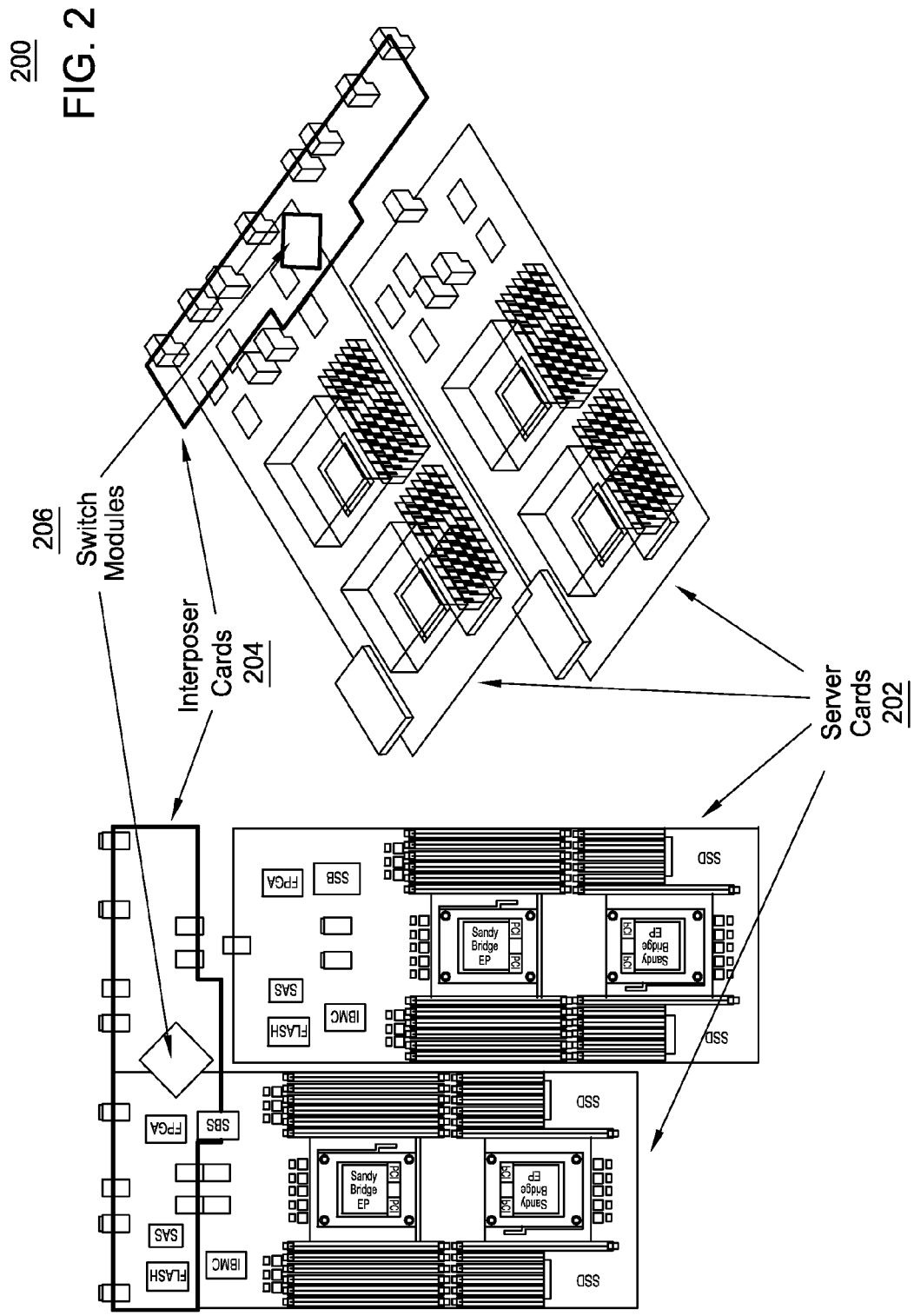
FIG. 2 illustrates a configuration in which interposer cards are operatively connected to server cards in a server system, according to one embodiment of the invention.

FIG. 2 illustrates a configuration 200 in which interposer cards are operatively connected to server cards in a server system, according to one embodiment of the invention. Depending on the embodiment, the interposer card may also be coupled to the server cards and/or the midplane. As described above, in one embodiment, to reduce the impact of a repair action on a failed switch module, the server system is configured to include a midplane 123 and server cards 202, where the midplane and server cards 202 are operatively connected via one or more interposer cards 204. Each server card 202 may correspond to a server blade 104. Each interposer card 204 is hot-swappable and includes one or more switch modules 206. The switch modules 206 switch network traffic for one or more server cards 202 operatively connected with the respective interposer card.

In one embodiment, the server system is configured to detect failure of the switch module 206. Upon detecting failure of the switch module 206, the server system may output for display an indication to perform a repair action on the switch module 206. For example, the indication may be output for display in a graphical user interface (GUI) window or as an alert to be emailed to a user. Depending on the embodiment, the detecting and/or the outputting may be performed by any component of the server system, such as the server cards 202, the switch module 206 and/or firmware contained in the server system. For example, in one embodiment, the server system includes management firmware that monitors health of the server system and detects failure of the switch module 206.

Accordingly, when a switch module 206 fails, the interposer card 204 that includes the switch module 206 may be replaced with an interposer card having a functional switch module. Further, the interposer card 204 may be replaced without requiring the server system and/or switch fabric to be powered off or rebooted, because of the hot-swappable properties of the interposer cards, server cards and/or midplane. The interposer card having a functional switch module may then be reintegrated into the switch fabric via the configuration tool. Depending on the embodiment, the configuration tool may execute on the server system or on another computer connected to the server system via the network fabric 132.

Accordingly, during the duration of replacing the interposer card with the failed switch module, only the failed switch module and associated server cards are unreachable from the network fabric. During the duration of replacing the interposer card with the failed switch module, other switch modules and/or server cards operatively connected to the midplane remain reachable. Accordingly, the impact of the repair action on the failed switch module is localized to the server cards associated with the failed switch module. In other words, the only network nodes that are unreachable from the network fabric during the repair action are the network nodes associated with the server cards operatively connected to the failed switch module.

Figure 3:
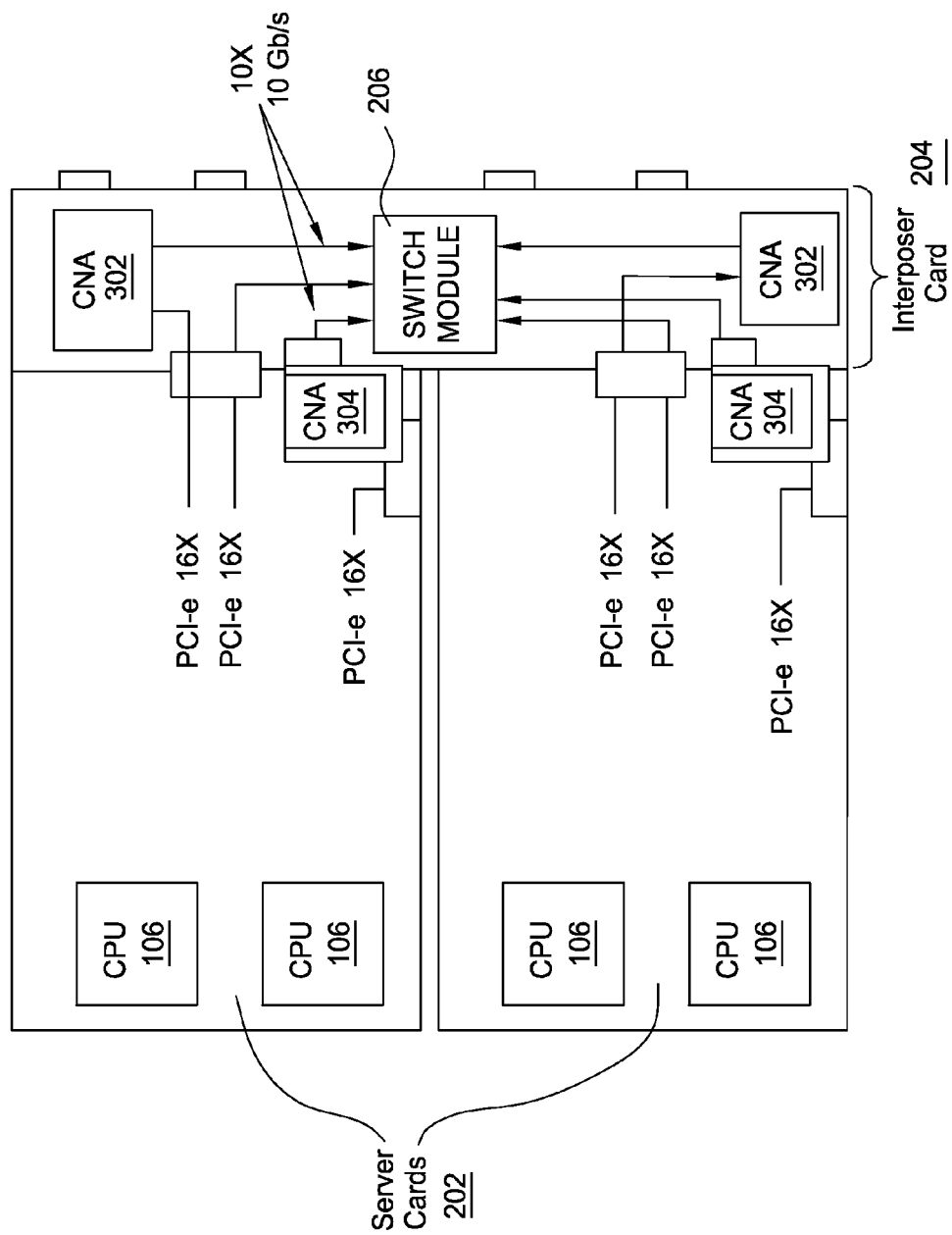
FIG. 3 illustrates a configuration in which an interposer card is operatively connected to two server cards in a server system, according to one embodiment of the invention.

FIG. 3 illustrates a configuration 300 in which an interposer card is operatively connected to two server cards in a server system, according to one embodiment of the invention.

As shown, the interposer card 204 includes the switch module 206 and two Converged Network Adapters (CNAs) 302. The two server cards 202 may each also include two CPUs 106 and a CNA 304. In one embodiment, the CPUs 106 connect to FCoE with CNAs, which contain both Fibre Channel Host Bus Adapter (HBA) and Ethernet NIC functionality. The CNAs may include one or more physical Ethernet ports and may be configured to offload—from the CPUs 106—low level frame processing and/or SCSI protocol functionality traditionally performed by Fibre Channel host bus adapters. As described above, the switch module 206 switches network traffic for the server cards 202. If the switch module 206 fails, the configuration 300 allows the switch module 206 to be replaced without requiring reboot of server cards of other interposer cards coupled with the midplane.

Figure 4:
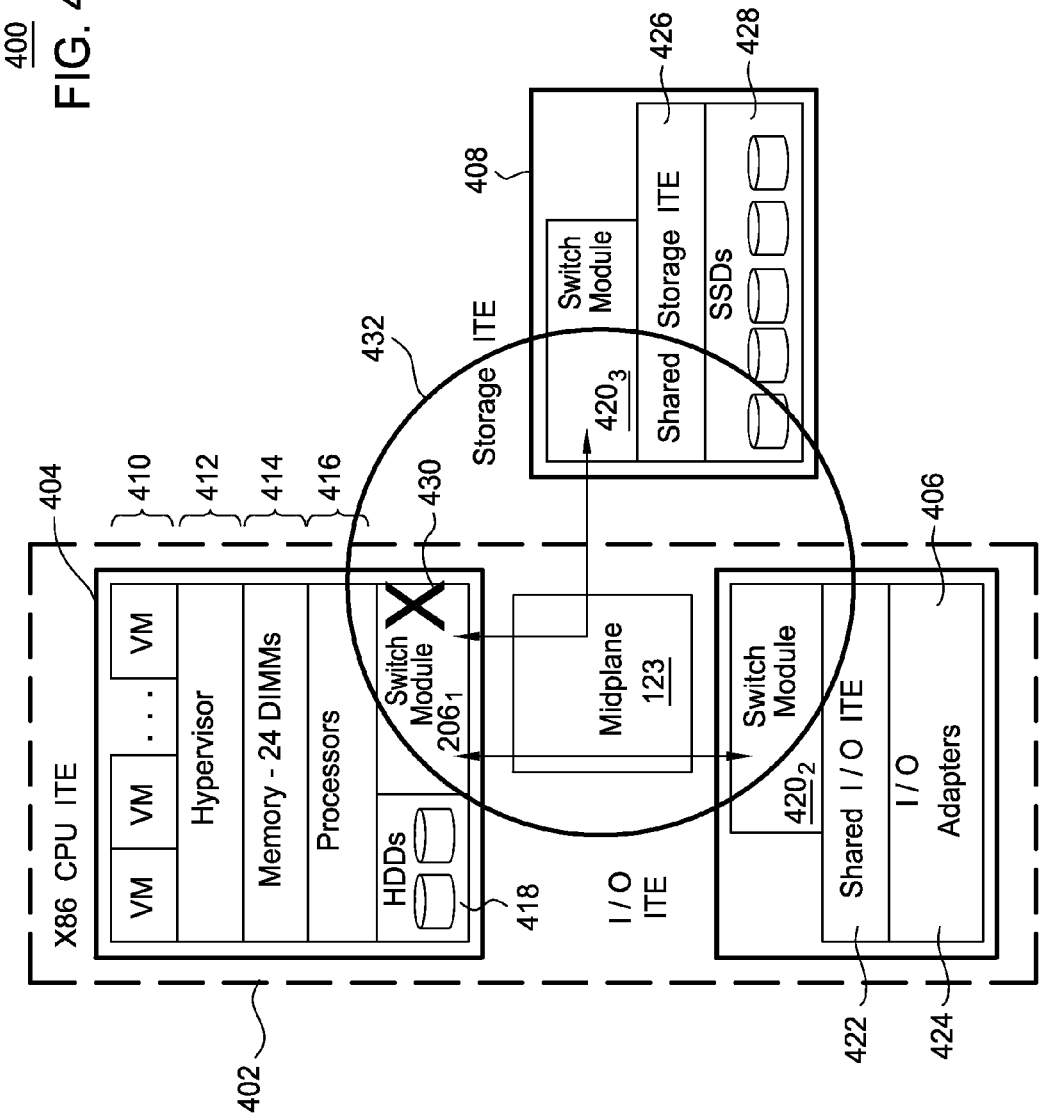
FIG. 4 illustrates a server system configured to reduce impact of a repair action on a switch module, according to one embodiment of the invention.

FIG. 4 illustrates a server system 400 configured to reduce impact of a repair action on a switch module, according to one embodiment of the invention. As shown, the server system 400 includes a logical server 402 configured across a processor information technology element (ITE) 404 and an I/O ITE 406. As used herein, an ITE generally refers to any appliance configured to operatively connect to the midplane 123. In an alternative embodiment, the logical server 402 may also be configured across a storage ITE 408. The I/O ITE 406 and storage ITE 408 are configured to provide additional I/O capacity and storage capacity, respectively, to one or more processer ITEs. Depending on the embodiment, each ITE 404, 406, 408 may be integrated as part of one or more server blades or may be coupled with the midplane 123 as a standalone card. The processor ITE 404 includes one or more virtual machines 410, a hypervisor 412, memory 414, processors 416 and hard disk drives 418. The I/O ITE 406 includes a shared I/O ITE component 422 and I/O adapters 424, while the storage IT 408 includes a shared storage ITE component 426 and solid state drives 428.

In one embodiment, the server blade 404 and the ITEs 406, 408 each further include a switch module 206. Each switch module 206 may be a switch chip and may be included in an interposer card (not shown) that is disposed between the midplane 123 and the processor ITE 404 and/or ITE 406, 408. Collectively, the switch modules 206 provide a switch fabric 432. A failing of the switch module $206_1$ of the processor ITE 404—denoted by an X symbol 430—impacts only the processor ITE 404 and not other ITEs operatively connected to the midplane 123. Accordingly, other logical servers configured across the I/O ITE 406 and/or storage ITE 408 remain operational, and connectivity in the switch fabric 432 remains largely operational—i.e., except for connectivity to the processor ITE 404. Depending on the embodiment, the connectivity in the switch fabric 432 that remains operational may also include redundant connectivity in the switch fabric 432. Further, the switch module $206_1$ may be replaced without impacting the other ITEs, logical servers, and/or the switch fabric 432. Accordingly, availability of the switch fabric 432 may be improved.

Figure 5:
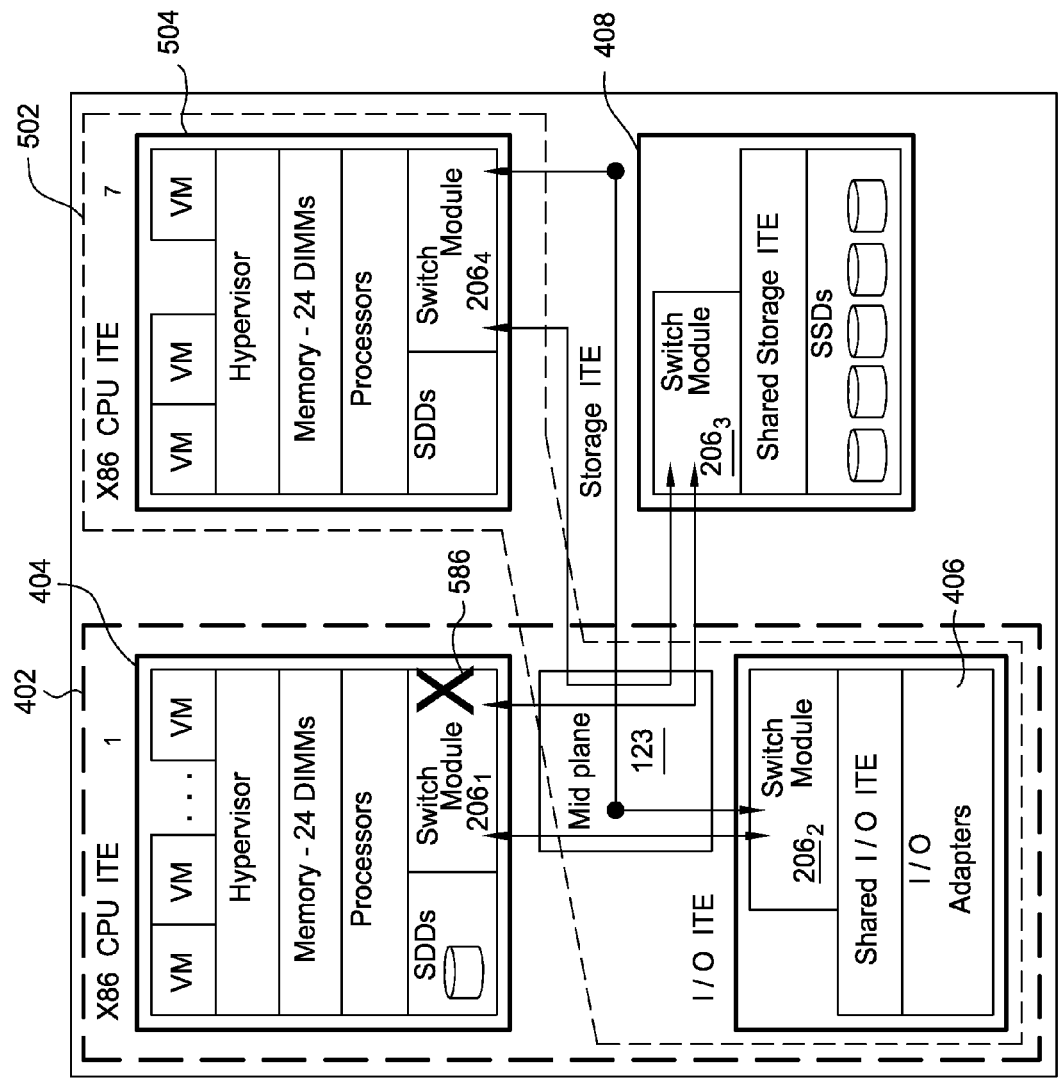
FIG. 5 also illustrates a server system configured to reduce impact of a repair action on a switch module, according to one embodiment of the invention.

FIG. 5 also illustrates a server system 500 configured to reduce impact of a repair action on a switch module, according to one embodiment of the invention. As shown, the server system 500 includes a first logical server 402 configured across a first processor ITE 404 and the I/O ITE 406. The server system 500 also includes a second logical server 502 configured across a second processor ITE 504 and the I/O ITE 406. In an alternative embodiment, the first logical server 402 and/or the second logical server 502 may also be configured across the storage ITE 408. The ITEs 404, 406, 408, 504 each includes a switch module 206. A failing of the switch module $206_1$ of the processor ITE 404—denoted by an X symbol 506, impacts only the first processor ITE 404 and not the second processor ITE 504. Accordingly, the second processor ITE 504, the I/O ITE 406 and the storage ITE 408 remain operational and retain connectivity to the switch fabric during failure and/or replacement of the switch module $206_1$.

Figure 6:
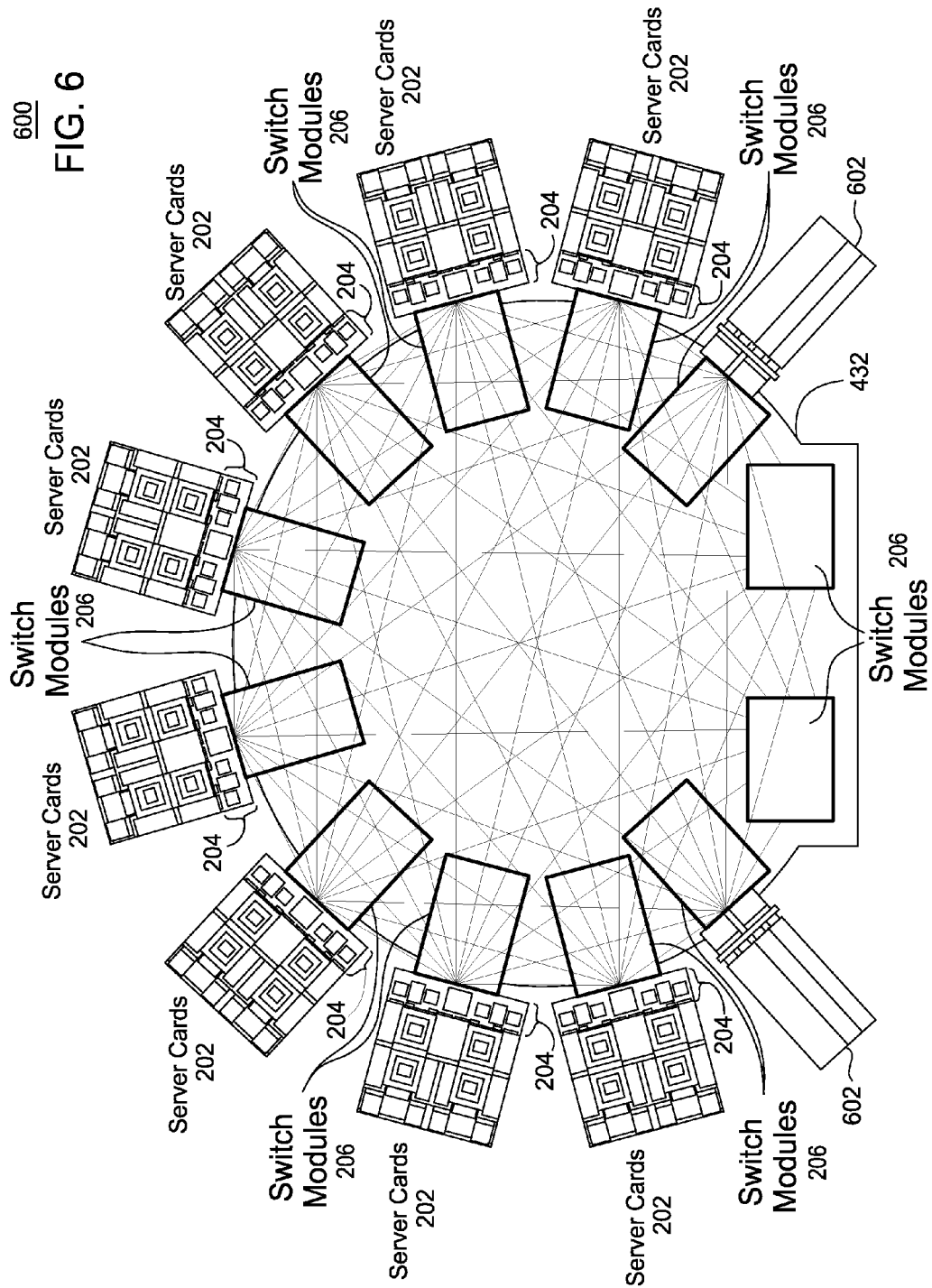
FIG. 6 illustrates a switch fabric for a server system, according to one embodiment of the invention.

FIG. 6 illustrates a switch fabric 432 for a server system, according to one embodiment of the invention. As shown, the switch fabric 432 includes a plurality of switch modules 206, each included in a respective interposer card 204. Each interposer card 204 operatively connects two server cards 202 to the switch fabric 432. Depending on the embodiment, the switch modules may be connected to one another in switch fabric via wiring housed in a midplane, cabling external to the midplane, or a combination thereof. Further, one or more of the switch modules 206 may be coupled with appliances 602 other than the server cards 202. Examples of appliances 602 include network appliances, storage appliances, and I/O appliances. Accordingly, failure and/or replacement of a switch module 206 impacts only the server cards 202 coupled with the switch module 206 and does not otherwise impact the rest of the switch fabric 432 and/or the other server cards.

Figure 7:
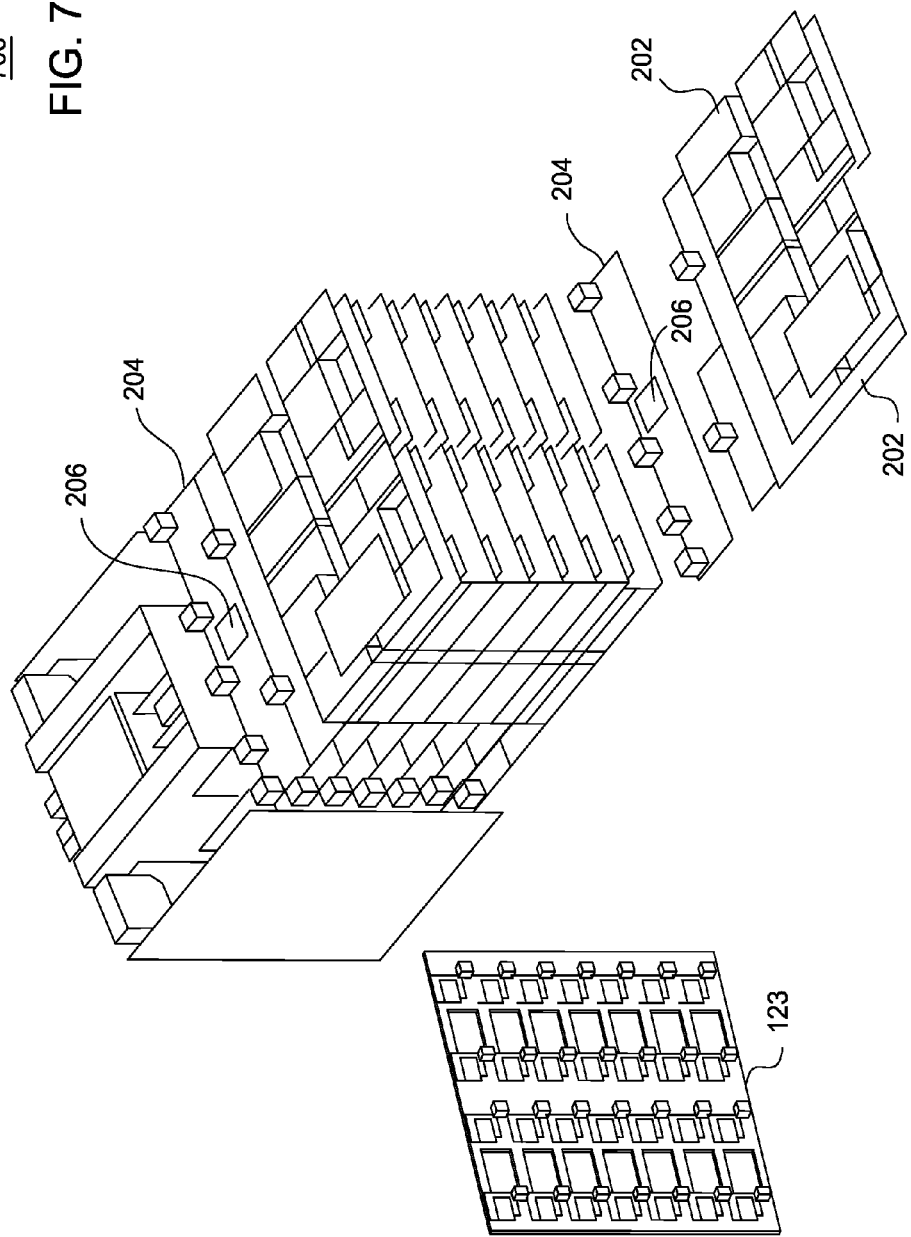
FIG. 7 illustrates a server system having a midplane that is coupled with multiple interposer cards, according to one embodiment of the invention.

FIG. 7 illustrates a server system 700 having a midplane 123 that is coupled with a plurality of interposer cards 204, according to one embodiment of the invention. Each interposer card 204 includes a switch module 206 and operatively connects one or two server cards 202 to the midplane 123. The midplane includes fabric wiring that connects the switch modules 206 to form a switch fabric. The server system 700 is configured such that the server cards 202 are hot-swappable from the interposer cards 204. The server system 700 is further configured such that the interposer cards 204 are hot-swappable from the midplane 123. Accordingly, the packaging and hot-swappable properties of the server system 700 allow a faulty switch module 206 to be replaced while minimizing or reducing impact to the server system 700 and/or the switch fabric.

Figure 8:
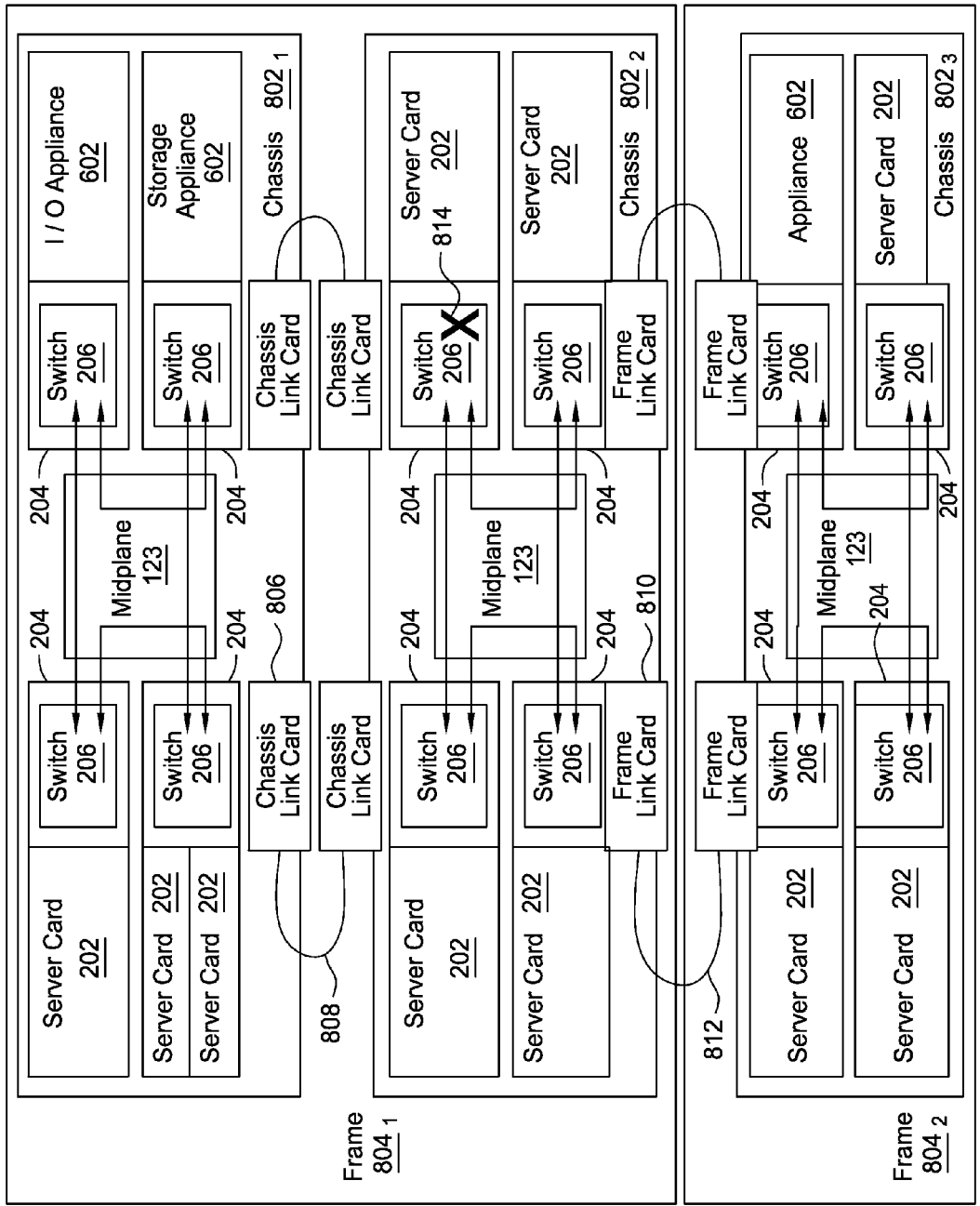
FIG. 8 illustrates a server system that includes multiple frames, according to one embodiment of the invention.

FIG. 8 illustrates a server system 800 that includes multiple frames 804, according to one embodiment of the invention. Each frame includes one or more chassis 802 that are operatively connected via chassis link cards 806 and associated cabling 808. Further, the chassis 802 may be operatively connected across two frames via frame link cards 810 and associated cabling 812. Each chassis 802 houses a midplane 123 that is coupled with one or two server cards 202 via an interposer card 204 according to the techniques disclosed herein. Each interposer card 204 includes a switch module 206 for switching traffic for the server cards 202. The midplanes 123 include fabric wiring for interconnecting the switch modules 206. Together, the switch modules 206, the fabric wiring, the chassis link cards 806 and associated cabling 808, and the frame link cards 810 and associated cabling 812 form a switch fabric for the server system 800. In other words, the switch fabric for the server system 800 includes cross-chassis and cross-frame interconnects. Accordingly, failure and/or replacement of a switch module 206—as denoted by an X symbol 814—merely removes an associated server card 202 from the switch fabric. Operation of the other server cards and/or connectivity of the switch fabric are thereby maintained during the failure and/or replacement of the switch module 206.

Figure 9:
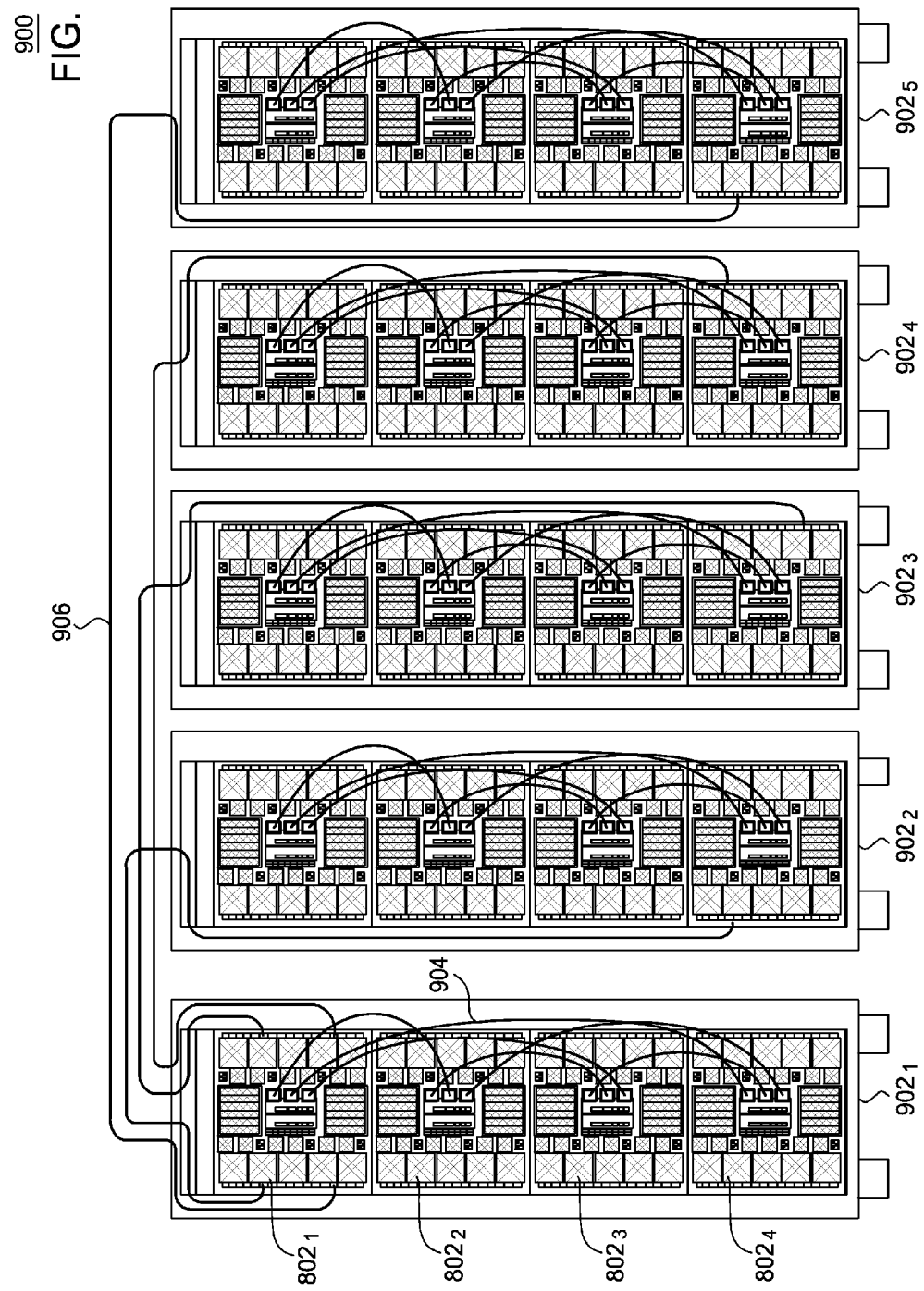
FIG. 9 illustrates a server system that includes multiple frames, each frame having four chassis, according to one embodiment of the invention.

FIG. 9 illustrates a server system 900 that includes multiple frames, each frame having four chassis 802, according to one embodiment of the invention. The chassis within each frame may be operatively connected via inter-chassis cabling 904. Chassis from different frames may be operatively connected via inter-frame cabling 906. Each chassis houses a midplane having fabric wiring, at least one interposer card having a switch module, and at least one server card according to the techniques disclosed herein. Together, the switch modules, the fabric wiring, the inter-chassis cabling 904, and the inter-frame cabling 906, and any associated link cards form a switch fabric for the server system 900. The server system 900 is thereby configured to increase availability of the switch fabric and/or of the server system 900 during failure and/or replacement of a switch module.

Figure 10:
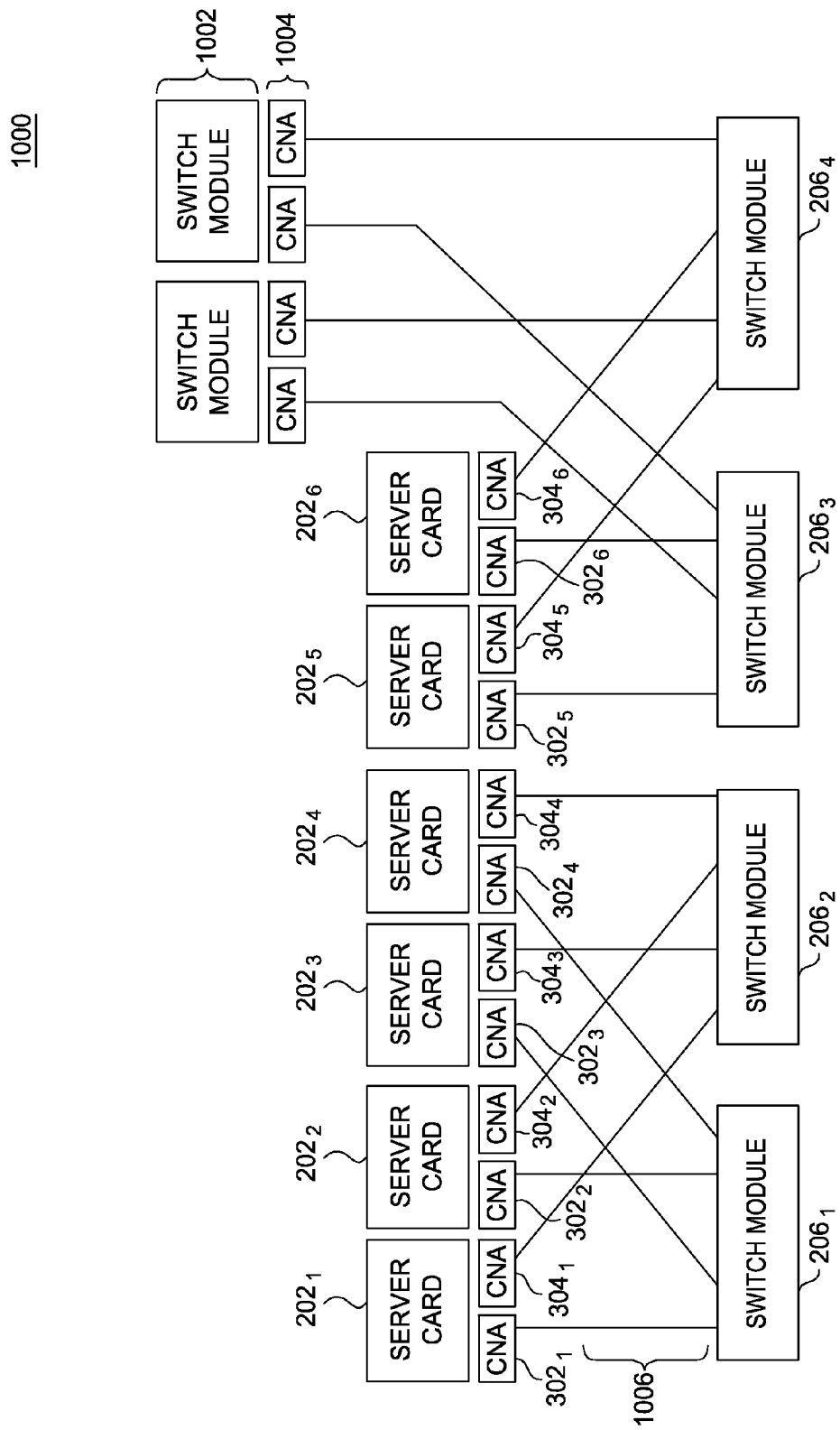
FIG. 10 illustrates a server system that is packaged to include an interposer interconnect, according to one embodiment of the invention.

FIG. 10 illustrates a server system 1000 packaged to include an interposer interconnect, according to one embodiment of the invention. As described above, the packaging of the server system 1000 may include an interposer interconnect 1006 between at least a first interposer card and a second interposer card. And each interposer card includes a switch module 206 coupled with two server cards 202. The interposer interconnect 1006 may include cabling between a network adapter of the first interposer card and a network adapter of the second interposer card. Such cabling may itself be external to the midplane. Each network adapter may be a CNA 302 of the respective interposer card or a CNA 304 of the respective server card. The server system 1000 may also include switch modules 1002 that provide connectivity to external server systems and/or storage controllers. The switch modules 1002 may be operatively connected to the switch modules 206 via one or more CNAs 1004.

Accordingly, when a switch module $206_1$ of the first interposer card fails, a switch module $206_2$ of the second interposer card may switch network traffic for the server cards $202_1$, $202_2$ of the first interposer card—in addition to switching network traffic for the server cards $202_3$, $202_4$ of the second interposer card. Thus, packaging the server system to include the interposer interconnect 1006 eliminates the switch module $206_1$ of the first interposer card as an SPOF. In other words, the server cards $202_1$, $202_2$ of the first interposer card retain connectivity to the switch fabric and/or maintain redundancy thereof, even upon failure of the switch module $206_1$ of the first interposer card.

In one embodiment, the interposer interconnect 1006 may further include cabling between CNAs $302_3$, $302_4$ of the second interposer card to the switch module $206_1$ of the first interposer card. Doing so eliminates the switch module $206_2$ of the second interposer card as an SPOF—in addition to eliminating the switch module $206_1$ as an SPOF. Accordingly, both the switch module $206_1$ of the first interposer card and the switch module $206_2$ of the second interposer card are eliminated as SPOFs.

In one embodiment, the CNA $302_4$ is connected to the switch module $206_1$ via cabling and provides redundancy for the second interposer card. Accordingly, when the switch module $206_2$ of the second interposer card fails, the switch module $206_1$ of the first interposer card may switch network traffic for the server cards $202_3$, $202_4$ of the second interposer card—in addition to switching network traffic for the server cards $202_1$, $202_2$ of the first interposer card.

More generally, packaging the server system 1000 to include the interposer interconnect 1006 between pairs of interposer cards eliminates the switch modules of the each interposer card as an SPOF. Each pair of interposer cards may include two interposer cards that are adjacent to one another according to a predefined axis within a chassis of the server system 1000. In an alternative embodiment, each pair of interposer cards resides in a single rack in the server system 1000. The predefined axis may include an x-axis, a y-axis, a z-axis, or any axis suited for describing relative positions of the interposer cards within the chassis of the server system 1000.

Further, although embodiments are herein described with reference to pairs of interposer cards being interconnected together, other embodiments are broadly contemplated. For example, in an alternative embodiment, three or more interposer cards may be interconnected in a daisy-chained manner. In this example, the interposer interconnect includes: (i) cabling between a CNA of the first interposer card and a switch module of the second interposer card, (ii) cabling between a CNA of the second interposer card and a switch module of the third interposer card, and (iii) cabling between a CNA of the third interposer card and a switch module of the first interposer card. In an alternative embodiment, the interposer interconnect includes cabling between the CNA of the third interposer card and the switch module of the second interposer card (rather than the first interposer card). Further, to provide additional redundancy, each interposer card may be interconnected with multiple other interposer cards. For example, the interposer interconnect may include: (i) cabling between a first CNA of the third interposer card and a switch module of the first interposer card and (ii) cabling between a second CNA of the third interposer card and a switch module of the second interposer card. Accordingly, if switch module failures occur in the second and third interposer cards, respectively, then the first interposer card is configured to switch network traffic for server cards coupled with the third interposer card. Those skilled in the art will recognize that any predefined number of interposer cards may be interconnected using the techniques disclosed herein.

Figure 11:
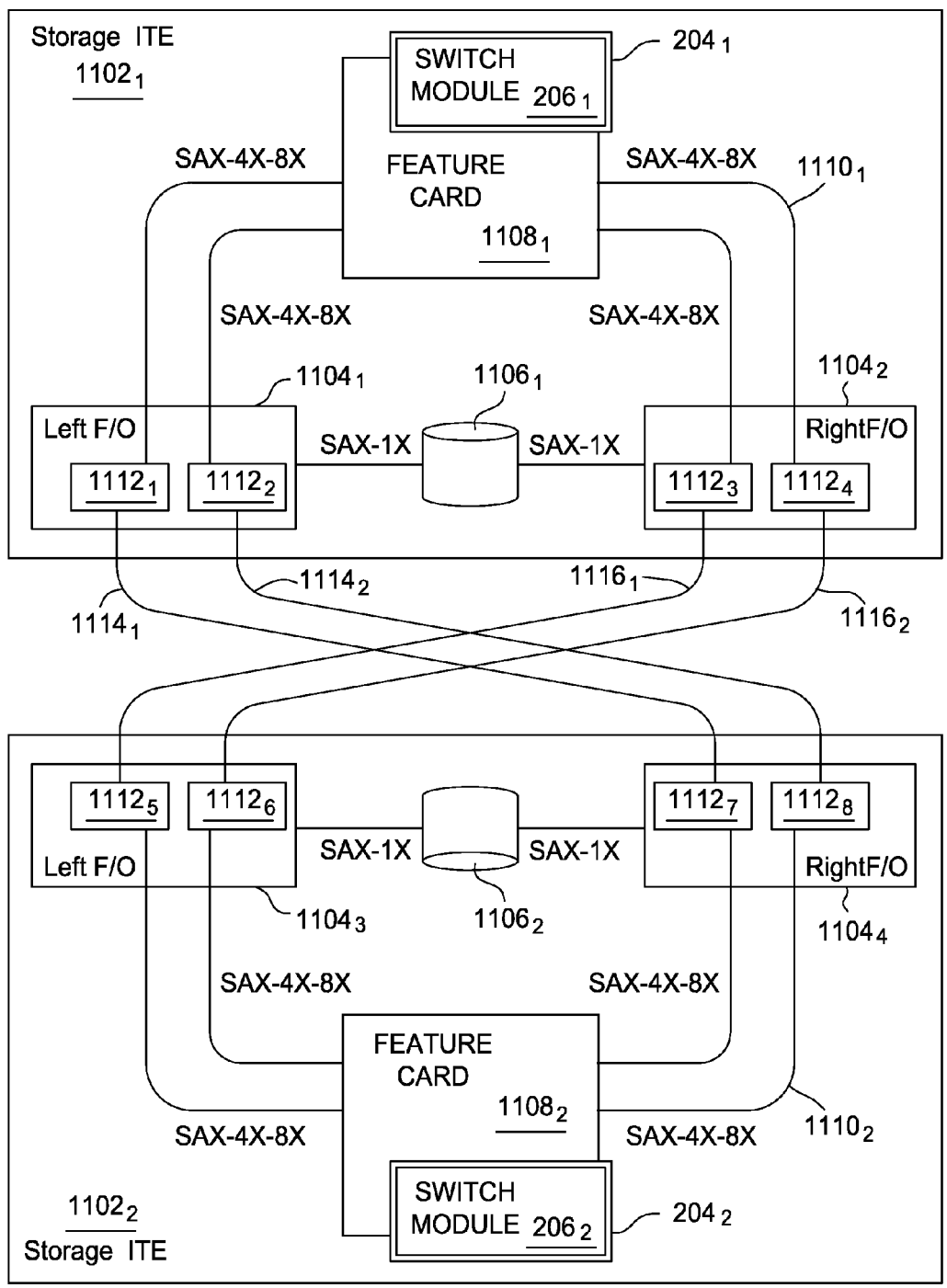
FIG. 11 illustrates a configuration of a server system that eliminates a switch module as an SPOF in a pair of storage ITEs, according to one embodiment of the invention.

FIG. 11 illustrates a configuration 1100 of a server system that eliminates a switch module 206 as an SPOF in a pair of storage ITEs, according to one embodiment of the invention. The configuration 1100 includes a first storage ITE $1102_1$ and a second storage ITE $1102_2$. Each storage ITE $1102_1$, $1102_2$ may be connected to the midplane via an interposer card 204 that includes a switch module 206. In an alternative embodiment, each storage ITE is coupled with the midplane and includes the switch module 206. As shown, each storage ITE includes a plurality of components, including a feature card 1108, two fanout cards 1104 and a storage device 1106. The feature card 1108 of each storage ITE 1102 may be configured to customize functionality of the respective storage ITE 1102. For example, the feature card 1108 may be configured in order to customize the storage ITE as a RAID ITE, network-attached storage (NAS) ITE, and/or file cache ITE, etc. The fanout cards 1104 of each storage ITE 1102 provide network connectivity for the storage ITE 1102 and/or improve availability of the respective storage ITE 1102. Each fanout card 1104 includes one or more fanout components 1112. Each storage ITE 1102 may further include a storage interconnect $1110_1$, $1110_2$ that operatively connects the components of the respective storage ITE 1102. In one embodiment, the storage interconnects $1110_1$, $1110_2$ provide Serial Attached SCSI (SAS) connectivity between the components of the storage ITEs 1102. In alternative embodiments, the storage interconnects provide FCoE or Serial ATA (SATA) connectivity.

In one embodiment, the configuration 1100 further includes a switch interconnect, along with cabling 1114 between the storage interconnects 1110 of the storage ITEs 1102. The cabling 1114 may connect a fanout card $1104_1$ of the first storage ITE $1102_1$ to a fanout card $1104_4$ of the second storage ITE $1102_2$. Depending on the embodiment, to provide increased bandwidth, the switch interconnect may include cabling 1116 between an additional fanout card of the each storage ITE 1102. Accordingly, when the switch module $206_1$ of the first storage ITE $1102_1$ fails, a switch module $206_2$ of the second storage ITE $1102_2$ may switch network traffic for the first storage ITE $1102_1$—in addition to switching network traffic for the second storage ITE $1102_2$. Packaging the storage ITEs 1102 to include cabling 1114 between the storage interconnects 1110 eliminates each switch module $206_1$, $206_2$ as a SPOF, using the storage interconnects 1110 of the storage ITEs 1102.

Figure 12:
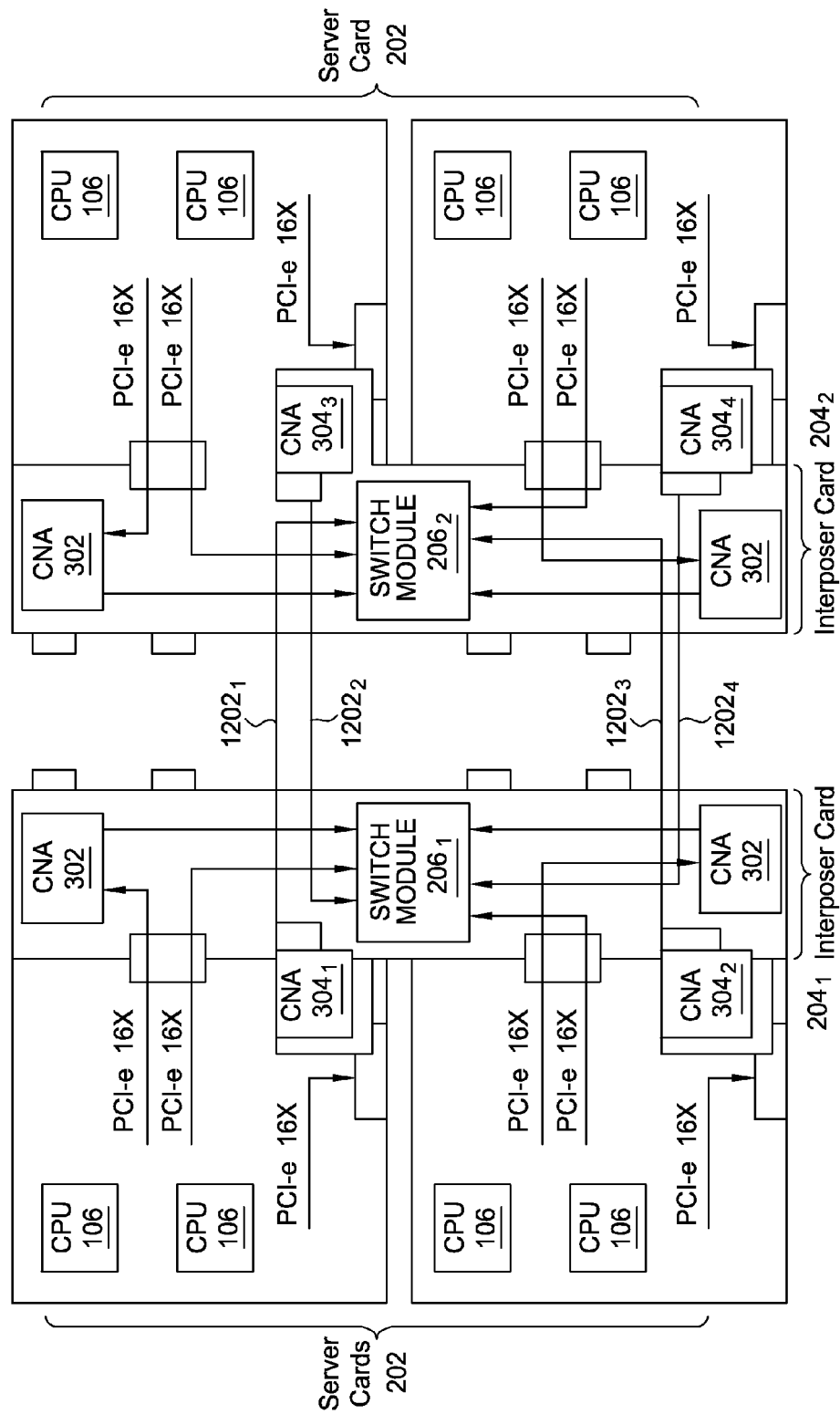
FIG. 12 illustrates a configuration of a pair of interconnected interposer cards, according to one embodiment of the invention.

FIG. 12 illustrates a configuration 1200 of a pair of interposer cards 204, where the configuration 1200 includes an interposer interconnect, according to one embodiment of the invention. Rather than using the storage interconnects to eliminate SPOFs, the configuration 1200 includes cabling between CNAs associated with different interposer cards to eliminate SPOFs. Each interposer card 204 includes a switch module 206 and operatively connects two server cards 202 to a midplane. The switch module 206 of each interposer card 204 is configured to switch network traffic for the server cards 202 coupled with the respective interposer card 204. Each interposer card 204 further includes one or more CNAs 302. Each server card 202 includes one or more CPUs 106. Depending on the embodiment, each server card 202 further includes one or more CNAs 304. The configuration 1200 of the interposer cards 202 may also include cabling 1202 between the interposer cards 202. The cabling 1202 may connect the CNAs $304_1$, $304_2$ of the server cards 202 coupled with the first interposer card $204_1$, to the switch module $206_2$ of the second interposer card $204_2$. The cabling 1202 may also connect the CNAs $304_3$, $304_4$ of the server cards 202 coupled with the second interposer card $204_2$, to the switch module $206_1$ of the first interposer card $204_1$.

Should the switch module $206_1$ of the first interposer card $204_1$ fail, the switch module $206_2$ of the second interposer card $204_2$ manages network traffic for the server cards 202 coupled with the first interposer card $204_1$—in addition to switching network traffic for the server cards 202 coupled with the second interposer card $204_2$. Thus, the configuration 1200 eliminates each of the switch modules 206 as an SPOF. In other words, the server cards 202 coupled with each interposer card retain connectivity to the switch fabric and/or maintain redundancy thereof, even upon failure of one of the switch modules 206.

As described above, packaging the server system to include one or more switch cards coupled with the midplane may eliminate the switch module as an SPOF. In such a case, the midplane includes a fabric interconnect for a switch fabric. The midplane may couple one or more chassis interconnect element (CIE) boards, which themselves include one or more management processing subsystems. Although embodiments are herein described with reference to the switch cards and the CIE boards as being separate components, depending on the embodiment, some or all of the functionality of the CIE boards may be integrated into the switch cards. The switch cards and/or the CIE boards may be coupled with a first face of the midplane, and one or more server cards may be coupled with a second face of the midplane.

In one embodiment, the switch cards and/or the CIE boards may be aligned along a first axis, and the server cards may be aligned along a second axis. Further, the first axis is at least substantially perpendicular to the second axis. For example, the switch cards may be vertically coupled with the first face of the midplane, and the server cards may be horizontally coupled with the second face of the midplane, or vice versa. Depending on the embodiment, the switch fabric includes wiring that connects each switch card with each server card and/or wiring that connects each switch card to each other switch card. Such wiring provides redundant pathing to reduce and/or eliminate SPORs and/or SPOFs in the switch fabric. Further, coupling the switch cards and the server cards with the midplane along perpendicular axes may simplify and/or reduce the amount of the wiring required (at least in some cases).

Figure 13:
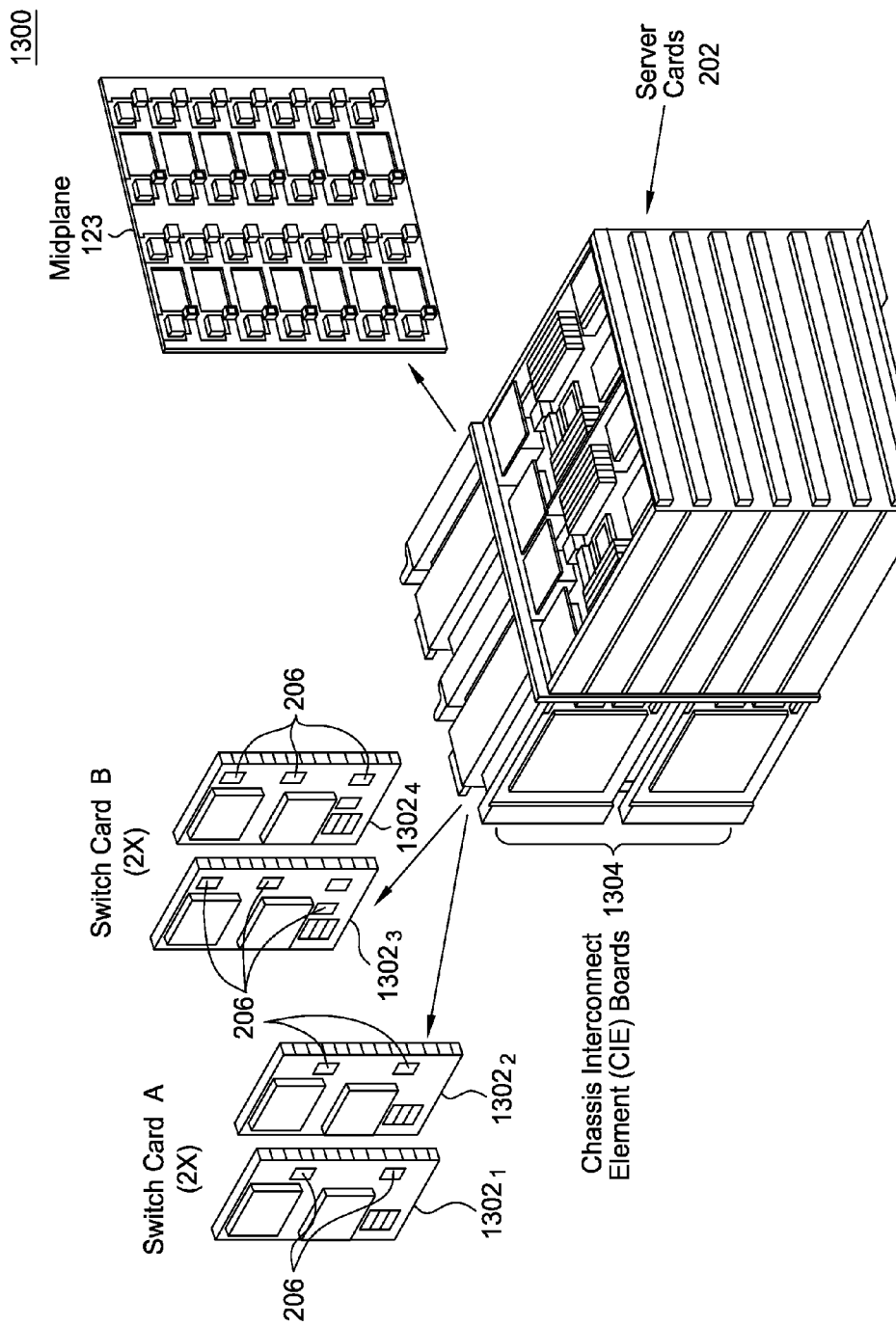
FIG. 13 illustrates a configuration of a server system that includes multiple switch cards, according to one embodiment of the invention.

FIG. 13 illustrates a configuration 1300 of a server system that includes multiple switch cards 1302, according to one embodiment of the invention. As shown, the configuration 1300 includes a midplane 123, server cards 202 and CIE boards 1304. The server cards 202 are horizontally coupled with the midplane 123, and the switch cards 1302 and the CIE boards 1304 are vertically coupled with the midplane 123. The switch cards 1302 and/or the server cards 202 may be hot-swappable from the midplane 123. Each switch card 1302 may include one or more switch modules 206, and each server card 202 may include one or more CPUs.

Depending on the embodiment, the switch fabric may include wiring between each switch card 1302 or each switch module 206 to each server card 202 or each CPU. The switch fabric may also include wiring between each switch card 1302 or switch module 206 to each other switch card 1302 or switch module 206. Accordingly, the configuration 1300 provides redundant pathing between elements in the switch fabric, thereby eliminating a switch module 206 and/or a switch card 1302 as an SPOF in the switch fabric. Specifically, the server cards 202 retain connectivity to the switch fabric upon failure of a switch module 206 or a switch card 1302. Further, a repair action on a failed switch module 206 or switch card 1302 does not impact the connectivity of the server cards 202 to the switch fabric. The repair action may include replacing the switch card 206 with a second switch card having a functional switch module and without restarting the server system and/or the switch fabric.

Figure 14:
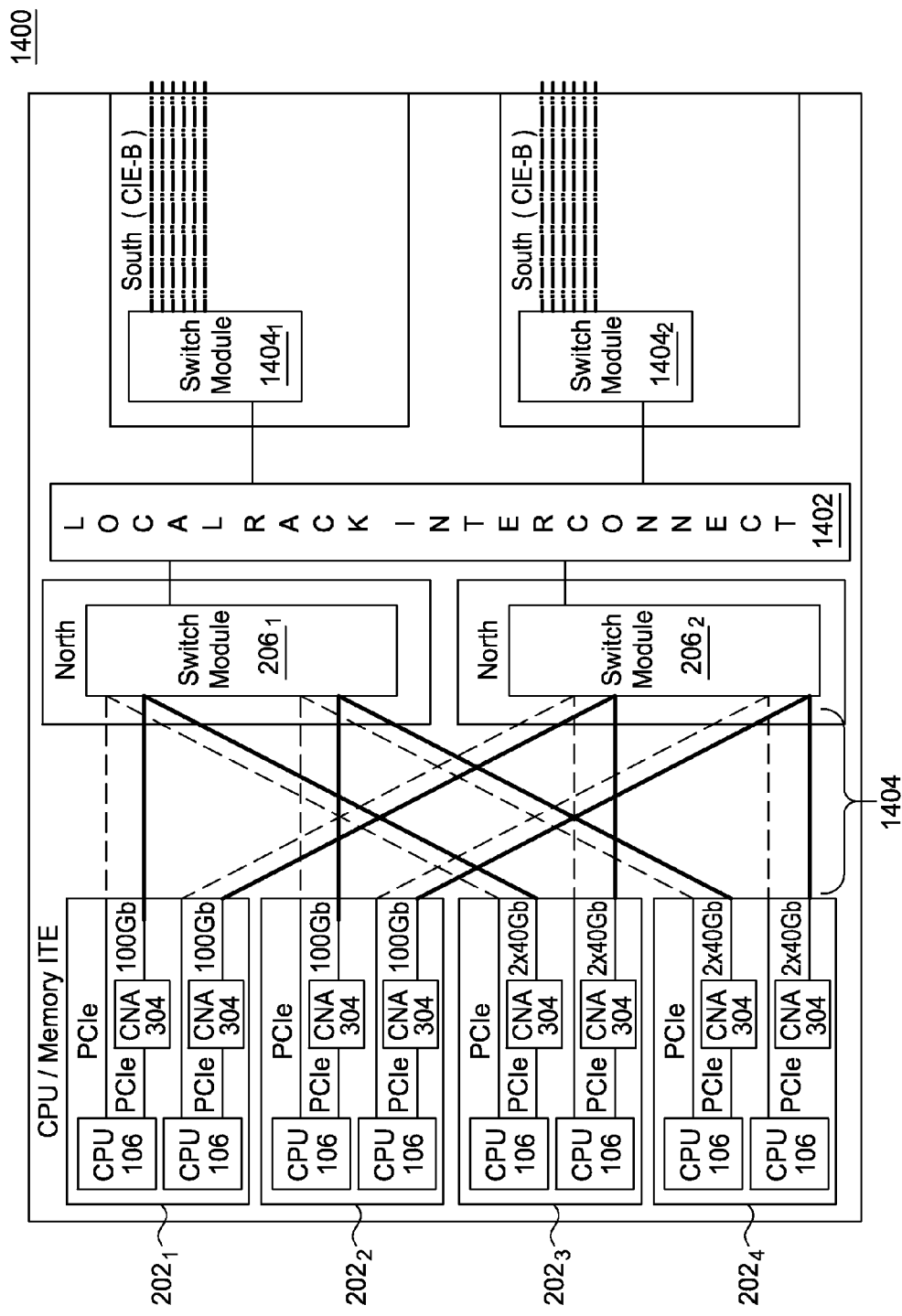
FIG. 14 illustrates a logical view of a configuration of a server system that includes multiple switch cards, according to one embodiment of the invention.

FIG. 14 illustrates a logical view 1400 of a configuration of a server system that includes multiple switch cards, according to one embodiment of the invention. As shown, the logical view 1400 includes multiple server cards 202 and multiple switch modules 206, 1304 of a server system. The server system may also include a fabric interconnect for a switch fabric. The switch modules 206 are disposed proximate to the server cards 202 in the switch fabric and provide redundancy in switching network traffic for the server cards 202. The switch modules 206 may also be referred to as north switch modules. The switch modules 1404 are disposed proximate to the north switch modules and provide connectivity between the north switch modules and the rest of the switch fabric. The switch modules 1404 may also be referred to as south switch modules.

In one embodiment, each server card 202 includes two CPUs 106 and two CNAs 304. The switch fabric may include wiring 1404 between each switch module 206 and each server card 202. The switch fabric may further include a local rack interconnect 1402, which in turn includes wiring between the switch modules 206 and the switch modules 1404. Depending on the embodiment, the local rack interconnect 1402 may also include wiring between each of the switch modules 206 and each other one of the switch modules 206, thereby providing all-to-all connectivity among the switch modules 206. Advantageously, the configuration eliminates each switch module 206 as an SPOF in the switch fabric. For example, should switch module $206_1$ fail, then the switch module $206_2$ may route network traffic for each server card 202. Doing so allows each server card 202 to remain connected to the switch fabric, despite the failure in switch module $206_1$.

Figure 15:
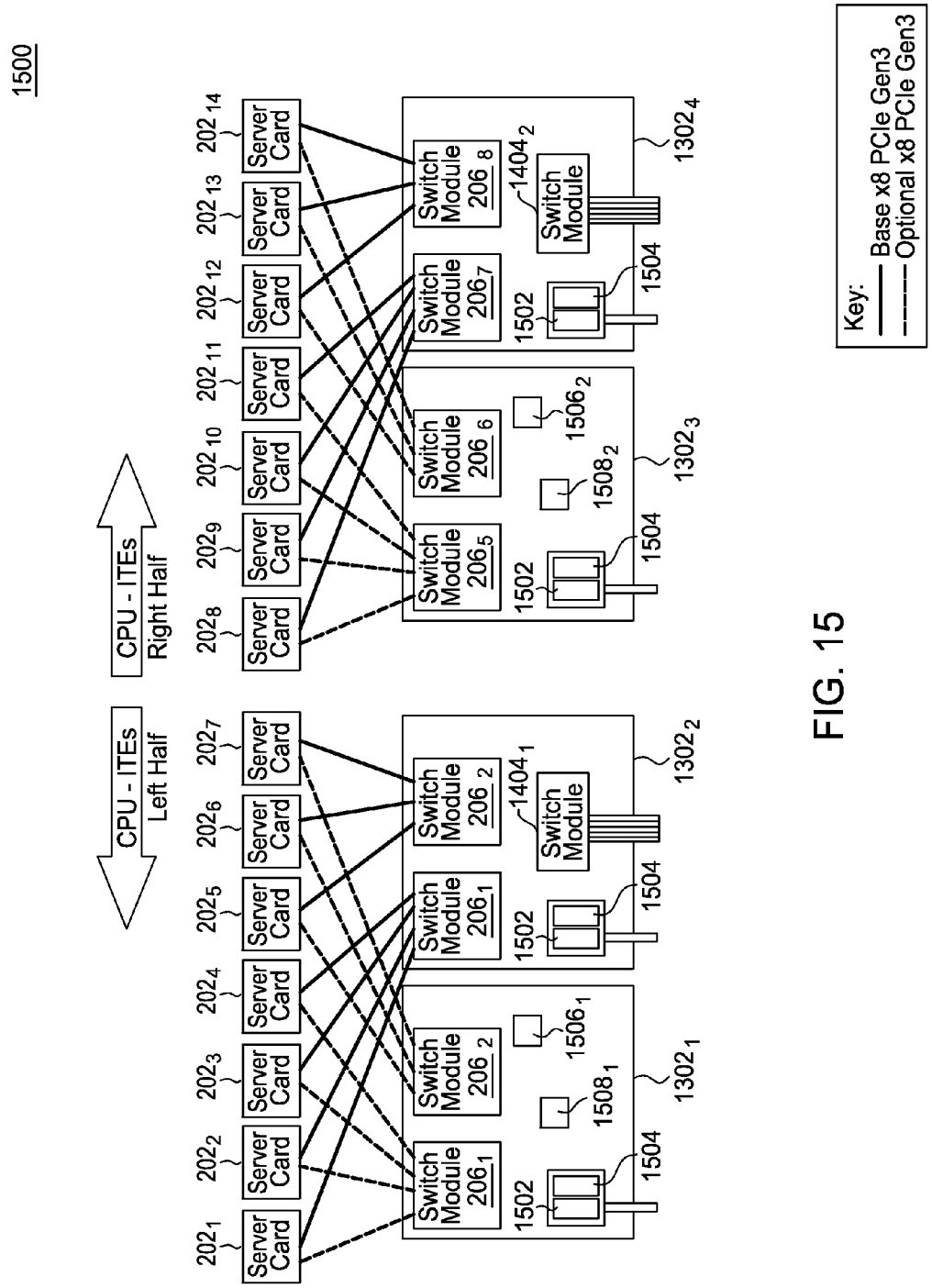
FIG. 15 illustrates a configuration of a server system that includes multiple switch cards, according to one embodiment of the invention.

FIG. 15 illustrates a configuration 1500 of a server system that includes multiple switch cards 1302, according to one embodiment of the invention. As shown, the multiple switch cards 1302 each include two switch modules 206, or north switch modules. Each switch module manages network traffic for at least one server card 202. The configuration 1500 includes wiring 1404 between each server switch module 206 and each of one subset of the server cards 202. For example, subsets of the server cards 202 may include a first subset having the server cards $202_{1-7}$ and a second subset having the server cards $202_{8-14}$. The configuration 1500 may also include all-to-all wiring (not shown) among each subset of the switch modules 206. For example, the subsets of the switch modules 206 may include a first subset having the switch modules $206_{1-4}$ and a second subset having the switch modules $206_{5-8}$. In other words, the switch cards 1302 and/or the server cards 202 may be physically partitioned into different subsets in terms of the wiring in the switch fabric, where the wiring provides connectivity and/or redundancy in the switch fabric. The configuration 1500 may also include further wiring across the subsets of switch modules 206.

In one embodiment, the switch cards $1302_{1,3}$ further include one or more management processing subsystems. The management processing subsystems include management firmware configured to monitor health of the server system and/or switch fabric elements, configure the elements, and/or detect and respond to failure of the elements. As shown, the management processing subsystems include an input/output master controller (IoMC) and a chassis service element (CSE). The IoMC manages elements in switch fabric, while the CSE includes manages components in the server chassis. Further, the IoMCs may be operatively connected to one another via an IoMC interconnect on the switch cards 1302, to provide redundancy in monitoring and/or managing the switch fabric, where the IoMC interconnect includes physical wiring between the IoMCs. Upon a failure of a first IoMC $1506_1$, a second IoMC $1506_2$ may be configured to provide switch fabric monitoring and/or management capabilities in lieu of the first IoMC $1506_1$. Advantageously, the configuration 1500 eliminates each switch module 206 as an SPOF and further eliminates each IoMC 1506 as an SPOF in the switch fabric.

In one embodiment, the switch cards $1302_{2,4}$ further include switch modules 1404, or south switch modules. As described above, the south switch modules provide connectivity between the north switch modules and the rest of the switch fabric. Each switch card 1302 further includes local links (L links) 1502 and distance links (D links) 1504. The L link 1502 provides the switch card 1302 with physical connectivity to another chassis within a single physical frame. The D link 1504 provides the switch card 1302 with physical connectivity to another chassis across physical frames. Accordingly, the switch fabric thereby includes additional redundant pathing for elements of the switch fabric.

Figure 16:
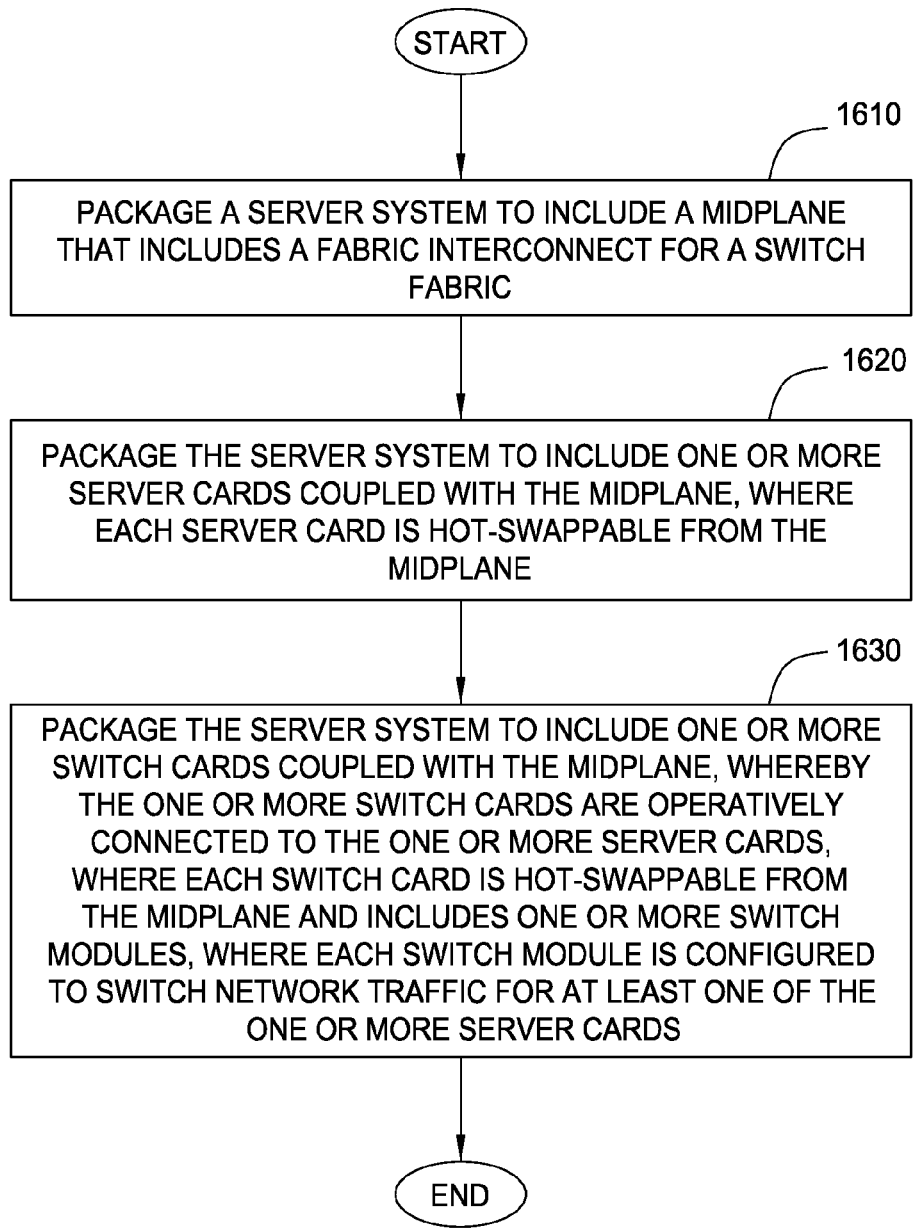
FIG. 16 is a flowchart depicting a method for reducing impact of a switch failure in a switch fabric, according to one embodiment of the invention.

FIG. 16 is a flowchart depicting a method 1600 for reducing impact of a switch failure in a switch fabric, according to one embodiment of the invention. As shown, the method 1600 begins at step 1610, where a provider of a server system packages the server system to include a midplane, where the midplane includes a fabric interconnect for a switch fabric. At step 1620, the provider of the server system further packages the server system to include one or more server cards coupled with the midplane, where each server card is hot-swappable from the midplane. At step 1630, the provider of the server system further packages the server system to include one or more switch cards coupled with the midplane, whereby the one or more switch cards are operatively connected to the one or more server cards. Each switch card is hot-swappable from the midplane and includes one or more switch modules. Each switch module is configured to switch network traffic for at least one server card. After the step 1630, the method 1600 terminates.

Figure 17:
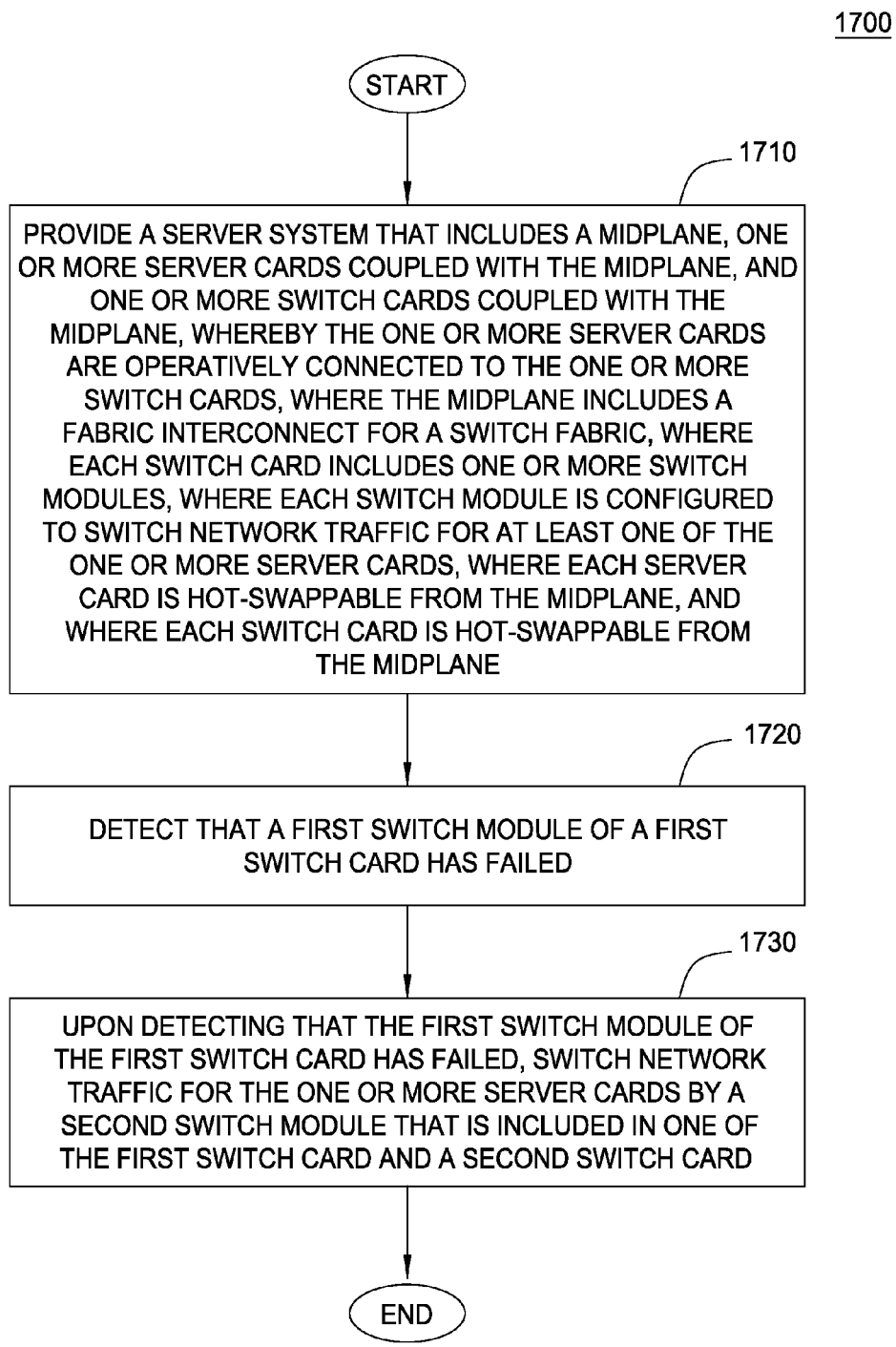
FIG. 17 is a flowchart depicting a method for eliminating a switch module as an SPOF, according to one embodiment of the invention.

FIG. 17 is a flowchart depicting a method 1700 for eliminating a switch module as an SPOF, according to one embodiment of the invention. As shown, the method 1700 begins at step 1710, where a server system is provided that includes a midplane, one or more server cards coupled with the midplane, and one or more switch cards coupled with the midplane, whereby the one or more server cards are operatively connected to the one or more switch cards. At step 1720, the server system detects that a first switch module of a first switch card has failed. For example, the detection may be performed by a management firmware component of the server system. At step 1730, upon the server system detecting that the first switch module of the first switch card has failed, a second switch module switches network traffic for the one or more server cards, wherein the second switch module is included in one of the first switch card and a second switch card. After the step 1730, the method 1700 terminates.

Advantageously, embodiments of the invention reduce the impact of a switch failure in a switch fabric. One embodiment of the invention is a server system having a midplane that itself includes a fabric interconnect for a switch fabric. The server system may further include one or more server cards coupled with the midplane. Each server card is hot-swappable from the midplane. The server system may further include one or more switch cards coupled with the midplane. And, the one or more switch cards are operatively connected to the one or more server cards. Each switch card is hot-swappable from the midplane and includes one or more switch modules. Each switch module is configured to switch network traffic for at least one server card.

In one embodiment, to provide redundant pathing, the switch fabric may include wiring between each switch card and each server card and/or wiring between each switch card and each other switch card. The server system may also include management firmware configured to detect and/or respond to a failed element in the switch fabric. Accordingly, when the switch module of a first switch card fails, a second switch module on the first switch card or on a second switch card is configured to route network traffic for the server cards supported by the switch module of the first switch card. Accordingly, this configuration of the server system eliminates the switch module of the first switch card as an SPOF.

Further still, some embodiments of the invention may also reduce impact of a repair action on the switch fabric. For example, should a switch module of the first switch card fail, then the first switch card may be replaced with a third switch card without powering off or restarting the server system and/or switch fabric. Doing so reduces the impact of the repair action (at least in some cases) as well as improves the availability of the server system and/or the switch fabric. Where the switch fabric provides redundancy in terms of connectivity, embodiments of the invention configure the server system so as to reduce impact that the repair action may have on the provided redundancy.

While the foregoing is directed to embodiments of the present invention, other and further embodiments of the invention may be devised without departing from the basic scope thereof, and the scope thereof is determined by the claims that follow.

What is claimed is:
1. A system to reduce impact of switch failure in a switch fabric and via switch cards, the system comprising:
a midplane comprising a fabric interconnect for the switch fabric;

one or more server cards coupled with the midplane, wherein each server card is hot-swappable from the midplane; and one or more switch cards coupled with the midplane, wherein the one or more switch cards are operatively connected to the one or more server cards, wherein each switch card is hot-swappable from the midplane and comprises one or more switch modules, wherein each switch module is configured to switch network traffic for at least one of the one or more server cards, and wherein a first switch module of a first switch card is configured to switch network traffic for the one or more server cards upon detection of a failure of a second switch module that is included in the first switch card, thereby reducing, via the one or more switch cards, impact of the failure of the first switch module and on the system.

2. The system of claim 1, wherein the one or more server cards are coupled with a first face of the midplane, and wherein the one or more switch cards are coupled with a second face of the midplane.

3. The system of claim 1, wherein the switch fabric comprises at least one of: (i) wiring between each switch card and each server card and (ii) wiring between each switch card and each other switch card.

4. The system of claim 1, wherein the one or more server cards are aligned on the midplane according to a first axis, and wherein the one or more switch cards are aligned on the midplane according to a second axis, and wherein the second axis is perpendicular to the first axis.

5. The system of claim 4, wherein the one or more server cards are horizontally coupled with a first face of the midplane, and wherein the one or more switch cards are vertically coupled with a second face of the midplane.

6. The system of claim 1, wherein at least one of a server card and a switch card is configured to be replaced with a functional replacement, without requiring a restart of the system and without requiring a restart of the switch fabric.

7. The system of claim 1, wherein the system is configured to integrate the functional replacement into the switch fabric, without requiring a restart of the system and without requiring a restart of the switch fabric.

8. The system of claim 1, wherein the system comprises a blade system, wherein each server card comprises a server blade, and wherein the network traffic comprises at least one of: (i) Ethernet traffic and (ii) Fibre Channel over Ethernet (FCoE) traffic.

9. The system of claim 1, wherein the one or more server cards include a plurality of compute nodes each having local storage and executing a respective hypervisor that in turn executes a respective plurality of virtual machines, wherein the plurality of server cards further includes a shared storage node configured to provide shared storage to at least the plurality of compute nodes, wherein the plurality of server cards further includes a shared input/output (I/O) node configured to provide shared I/O adapters to at least the plurality of compute nodes, wherein the system includes management firmware configured to monitor health of the system and detect that the switch module has failed, wherein an indication that the switch module has failed is output for display to a user via a graphical user interface (GUI) screen upon determining that the switch module has failed.

10. The system of claim 9, wherein the switch fabric comprises: (i) wiring between each switch card and each server card and (ii) wiring between each switch card and each other switch card, wherein the system is configured to:

in a first instance and upon detecting that the second switch module of the first switch card has failed, switch network traffic for the one or more server cards by the first switch module that is included in the first switch card; and in a second instance and upon detecting that the second switch module of the first switch card has failed, switch network traffic for the one or more server cards by a third switch module that is included in a second switch card different from the first switch card.

11. The system of claim 10, wherein the one or more server cards are aligned on the midplane according to a first axis, wherein the one or more switch cards are aligned on the midplane according to a second axis, wherein the second axis is perpendicular to the first axis, wherein at least one of a server card and a switch card is configured to be replaced with a functional replacement as at least part of a corrective action, without requiring a restart of the system and without requiring a restart of the switch fabric.

12. The system of claim 11, wherein the one or more server cards are horizontally coupled with a first face of the midplane, wherein the one or more switch cards are vertically coupled with a second face of the midplane, different from the first face, wherein the system is configured to integrate the functional replacement into the switch fabric, without requiring a restart of the system and without requiring a restart of the switch fabric.

13. The system of claim 12, wherein the corrective action is responsive to detecting that the second switch module of the first switch card has failed, wherein the system is configured to limit the impact of each of: (i) the failure of the switch module and (ii) the corrective action, to availability of the system, wherein the system comprises a blade system, wherein each server card comprises a server blade, wherein the network traffic comprises, in respective instances, each traffic type selected from: (i) Ethernet traffic and (ii) Fibre Channel over Ethernet (FCoE) traffic.

14. The system of claim 13, wherein the system includes a plurality of nodes including the plurality of compute nodes, the shared storage node, and the shared I/O node, wherein each node in the system and reachable from the switch fabric prior to failure of the switch module remains reachable from the switch fabric subsequent to failure of the switch module and prior to the corrective action, 15. The system of claim 14, wherein each node in the system and reachable from the switch fabric prior to failure of the switch module remains reachable from the switch fabric during the corrective action, wherein each node is selected from a compute node, a shared storage node, and a shared I/O node.

16. The system of claim 15, wherein the system is further configured to:

in a third instance and upon detecting that both the second and third switch modules have failed, switch network traffic for the one or more server cards by the first switch module that is included in the first switch card; and in a fourth instance and upon detecting that both the first and second switch modules have failed, switch network traffic for the one or more server cards by the third switch module that is included in the second switch card.

17. A switch module to reduce impact of switch failure in a switch fabric, the switch module comprising:

a computer processor; and a memory storing management firmware which, when executed on the computer processor, performs an operation comprising:

switching network traffic for a first server card in a server system; and upon detection of a failure of a second switch module that switches network traffic for a second server card, switching network traffic for the second server card; wherein the switch module is included in a first switch card, wherein the second switch module is included in the first switch card, wherein each switch card is coupled with a midplane, wherein each server card is coupled with the midplane, wherein the midplane comprises a fabric interconnect for the switch fabric, wherein each switch card is hot-swappable from the midplane, and wherein each server card is hot-swappable from the midplane, whereby impact of the failure of the second switch module and on the server system is reduced via the first switch card.

18. The switch module of claim 17, wherein each server card is coupled with a first face of the midplane, and wherein each switch card is coupled with a second face of the midplane.

19. The switch module of claim 17, wherein the switch fabric comprises at least one of: (i) wiring between each switch card and each server card and (ii) wiring between each switch card and each other switch card.

20. The switch module of claim 17, wherein each server card is aligned on the midplane according to a first axis, and wherein each switch card is aligned on the midplane according to a second axis, and wherein the second axis is perpendicular to the first axis.

21. The switch module of claim 20, wherein each server card is horizontally coupled with a first face of the midplane, and wherein each switch card is vertically coupled with a second face of the midplane.

22. The switch module of claim 17, wherein at least one of a server card and a switch card is configured to be replaced with a functional replacement, without requiring a restart of the system and without requiring a restart of the switch fabric.

23. The switch module of claim 17, wherein the server system is configured to integrate the functional replacement into the switch fabric, without requiring a restart of the server system and without requiring a restart of the switch fabric.

24. The switch module of claim 17, wherein the server system comprises a blade system, wherein each server card comprises a server blade, and wherein the network traffic comprises at least one of: (i) Ethernet traffic and (ii) Fibre Channel over Ethernet (FCoE) traffic.

* * * * *